United States Patent
Kim et al.

(10) Patent No.: US 9,246,513 B2
(45) Date of Patent: *Jan. 26, 2016

(54) METHOD AND APPARATUS FOR TRANSMITTING UPLINK DATA IN A WIRELESS ACCESS SYSTEM

(71) Applicant: LG ELECTRONICS INC., Seoul (KR)

(72) Inventors: Ki Hwan Kim, Anyang-si (KR); Young Seob Lee, Anyang-si (KR); Seung Hyun Kang, Anyang-si (KR); Jae Hoon Chung, Anyang-si (KR)

(73) Assignee: LG ELECTRONICS INC., Seoul (KR)

(*) Notice: Subject to any disclaimer, the term of this patent is extended or adjusted under 35 U.S.C. 154(b) by 399 days.

This patent is subject to a terminal disclaimer.

(21) Appl. No.: 13/757,691

(22) Filed: Feb. 1, 2013

(65) Prior Publication Data

US 2013/0262963 A1    Oct. 3, 2013

Related U.S. Application Data

(63) Continuation of application No. 13/488,332, filed on Jun. 4, 2012, which is a continuation of application No.
(Continued)

(30) Foreign Application Priority Data

| Aug. 14, 2007 | (KR) | 10-2007-0082032 |
| Aug. 16, 2007 | (KR) | 10-2007-0082236 |
| Nov. 23, 2007 | (KR) | 10-2007-0120389 |
| Nov. 23, 2007 | (KR) | 10-2007-0120390 |
| Nov. 23, 2007 | (KR) | 10-2007-0120391 |

(51) Int. Cl.
     *G06F 11/00*      (2006.01)
     *H03M 13/09*      (2006.01)
     *H04L 1/00*      (2006.01)

(52) U.S. Cl.
     CPC ........... *H03M 13/091* (2013.01); *H04L 1/0061* (2013.01); *H04L 1/0065* (2013.01); *H04L 1/0083* (2013.01)

(58) Field of Classification Search
     CPC ... H04L 1/0061; H04L 1/0078; H04L 1/0057; H03M 13/09; H03M 13/093; H03M 13/23; H03M 13/2714
     USPC .................................................. 714/758, 781
     See application file for complete search history.

(56) References Cited

U.S. PATENT DOCUMENTS

| 5,768,533 A | 6/1998 | Ran |
| 6,988,233 B2 | 1/2006 | Kanai et al. |

(Continued)

FOREIGN PATENT DOCUMENTS

| CN | 1397107 | 2/2003 |
| CN | 1533418 | 9/2004 |

(Continued)

OTHER PUBLICATIONS

Motorola, "Code Block Segmentation for LTE Channel Coding," R1-071059, 3GPP TSG RAN WG1 #48, Feb. 2007, XP-050105053, 6 pages.

(Continued)

*Primary Examiner* — Bryce Bonzo
*Assistant Examiner* — Elmira Mehrmanesh
(74) *Attorney, Agent, or Firm* — Lee, Hong, Degerman, Kang & Waimey

(57) ABSTRACT

A method of channel coding for transmitting data in a wireless access system includes: calculating a number C of code blocks by an equation of $C=\lceil B/(Z-L)\rceil$, wherein B denotes a size of an input bit sequence, wherein Z denotes a maximum size of the code blocks, and wherein L denotes a size of a cyclic redundancy check (CRC) which is to be attached to each of the code blocks; calculating a size B' of a modified input bit sequence by an equation of $B'=B+C*L$; generating the code blocks based on the number C of the code blocks and the size B' of the modified input bit sequence; and channel-coding the code blocks.

12 Claims, 11 Drawing Sheets

Related U.S. Application Data

12/191,939, filed on Aug. 14, 2008, now Pat. No. 8,219,877.

(60) Provisional application No. 61/028,478, filed on Feb. 13, 2008, provisional application No. 60/957,454, filed on Aug. 23, 2007, provisional application No. 60/957,369, filed on Aug. 22, 2007, provisional application No. 60/957,334, filed on Aug. 22, 2007, provisional application No. 60/957,063, filed on Aug. 21, 2007.

(56) References Cited

U.S. PATENT DOCUMENTS

| | | |
|---|---|---|
| 7,133,388 B2 | 11/2006 | Belaiche |
| 7,853,857 B2 | 12/2010 | Buckley et al. |
| 7,873,893 B2 | 1/2011 | Nimbalker et al. |
| 8,386,878 B2 | 2/2013 | Pi et al. |
| 2003/0023929 A1 | 1/2003 | Kajita |
| 2003/0123409 A1 | 7/2003 | Kwak et al. |
| 2005/0053163 A1 | 3/2005 | Yoon et al. |
| 2008/0098273 A1 | 4/2008 | Blankenship et al. |
| 2008/0141095 A1 | 6/2008 | Cai et al. |
| 2009/0070653 A1 | 3/2009 | Kim et al. |
| 2009/0077447 A1 | 3/2009 | Buckley et al. |
| 2012/0240009 A1 | 9/2012 | Kim et al. |

FOREIGN PATENT DOCUMENTS

| | | |
|---|---|---|
| EP | 1626515 | 2/2006 |
| JP | 2010-531613 | 9/2010 |
| JP | 5-228047 | 7/2013 |
| KR | 10-2000-0050784 | 8/2000 |
| KR | 10-2001-0015164 | 2/2001 |
| RU | 2116696 | 7/1998 |
| RU | 2352073 | 4/2009 |
| WO | 00/52831 | 9/2000 |

OTHER PUBLICATIONS

Samsung, "Analysis of Per Code Block CRC and Per Transport Block CRC," R1-073108, 3GPP TSG RAN WG1 Meeting #49-bis, Jun. 2007, XP-050106759, 4 pages.

LG Electronics, "On the Consideration of CRC Attachment," R1-073504, 3GPP TSG RAN WG1 Meeting #50, Aug. 2007, XP-050107110, 4 pages.

Motorola et al., "Text Change to Code Block Segmentation," R1-073863, 3GPP TSG RAN1#50, Aug. 2007, XP-050107426, 4 pages.

Ericsson, "Correction of Reference Measurement Channel for 2048 kbps," R4-020376, TSG-RAN WG4 (Radio) Meeting #21, Jan. 2002, XP-050170230, 2 pages.

3rd Generation Partnership Project (3GPP), "Technical Specification Group Radio Access Network; Multiplexing and Channel Coding (Release 8)," 3GPP TS 36.212, v1.2.0, May 2007, XP-050377544, 16 pages.

COST 273 SWG2.2, "Communication Performance Measurements for 3G User Equipment Including the Antenna", R4-020074, TSG-RAN Working Group 4 (Radio) meeting #21, Jan.-Feb. 2002, 7 pages.

The State Intellectual Property Office of the People's Republic of China Application Serial No. 200880111567.9, Office Action dated Dec. 11, 2012, 7 pages.

3rd Generation Partnership Project (3GPP), "Technical Specification Group Radio Access Network; Multiplexing and channel coding (Release 8)," 3GPP TS 36.212 V1.3.0, Jul. 2007, 20 pages.

3rd Generation Partnership Project (3GPP), "Technical Specification Group Radio Access Network; Evolved Universal Terrestrial Radio Access (E-UTRA); Multiplexing and channel coding (Release 8)," 3GPP TS 36.212 V2.0.0, Sep. 2007, 30 pages.

U.S. Appl. No. 13/488,332, Office Action dated Mar. 13, 2015, 8 pages.

METHOD AND APPARATUS FOR TRANSMITTING UPLINK DATA IN A WIRELESS ACCESS SYSTEM

CROSS-REFERENCE TO RELATED APPLICATIONS

This application is a continuation of U.S. application Ser. No. 13/488,332, filed on Jun. 4, 2012, now U.S. Pat. No. 9,154,162, which is a continuation of U.S. application Ser. No. 12/191,939, filed on Aug. 14, 2008, now U.S. Pat. No. 8,219,877, which claims the benefit of earlier filing date and right of priority to Korean Patent Application Nos. 10-2007-0082032, filed on Aug. 14, 2007, 10-2007-0082236, filed on Aug. 16, 2007, 10-2007-0120389, filed on Nov. 23, 2007, 10-2007-0120390, filed on Nov. 23, 2007, and 10-2007-0120391, filed on Nov. 23, 2007, and also claims the benefit of U.S. Provisional Application Nos. 60/957,063 filed on Aug. 21, 2007, 60/957,334, filed on Aug. 22, 2007, 60/957,369, filed on Aug. 22, 2007, 60/957,454 filed on Aug. 23, 2007, and 61/028,478 filed on Feb. 13, 2008, the contents of all of which are incorporated herein by reference in their entireties.

BACKGROUND OF THE INVENTION

1. Field of the Invention

The present invention relates to a method of transmitting data in a wireless access system, and more particularly, to various methods of dividing input data into code blocks in consideration of the size of an error detection code.

2. Discussion of the Related Art

In transmitting data, data transmission efficiency and reliable data transmission are important. To increase data transmission efficiency, methods of dividing data before transmission and methods using an error detection code to check whether data contains an error are generally used.

Error control refers to a mechanism for detecting and correcting errors generated during data transmission. Error control schemes include an automatic repeat request (ARQ) scheme, a forward error correction (FEC) scheme, and a backward error correction (BEC) scheme.

The ARQ scheme allows, for reliable data transmission on a communication line, a receiving side to check whether an error occurs by means of an acknowledgement (ACK) signal and timeout and allows a transmitting side to retransmit a frame in which an error has occurred. The ARQ scheme, which is called an automatic retransmission request scheme, allows a receiving side to detect an error and to request data retransmission. In the FEC scheme, a transmitting side adds redundancy to characters or frames before transmission and a receiving side detects and corrects errors using the redundancy. The BEC scheme adds redundancy for detecting errors and transmits an ARQ signal for data retransmission to a transmitting side.

Error detection refers to a technique for allowing a receiving side to recognize whether an error has occurred during transmission. An error detection code refers to a code supporting the error detection technique. Error detection techniques include parity check, checksum, cyclic redundancy check (CRC), and weighted code techniques.

Error correction refers to a coding technique including sufficient redundancy in a transmitted data block such that a receiving side can infer transmission characters from the received data block. In terms of an open system interconnection (OSI) layer model, error correction is mainly implemented in a data link layer. Meanwhile, error detection refers to a coding technique in which redundancy is added so that the receiving side can detect the occurrence of an error and make a request for retransmission.

The error correction includes a block code scheme in which a prescribed length of redundancy is added to a predetermined length of information (signal) so that a receiving side can correct errors and a convolutional code scheme in which a coder has a memory to use, during coding, a part of previously input signals in addition to currently input signals.

A block code includes Hamming codes, Reed-Solomon codes as cyclic codes, Bose-Chaudhuri-Hocquenghem (BCH) codes, and cyclic redundancy check (CRC) codes. A convolution code includes Viterbi codes and turbo codes.

The parity check is most generally used when the number of information bits is small and the likelihood of error generation is low. Although the parity check is widely used in asynchronous communication due to simplicity thereof, it is difficult to detect errors when the number of errors is an even number. The parity check includes an odd parity check in which the number of 1's in characters coding parity bits is set to an odd number and an even parity check in which the number of 1's in characters coding parity bits is set to an even number.

The CRC, which is one of error detection methods, refers to a technique in which a transmitting side adds a result extracted by a polynomial from transmitted data to a frame check sequence (FCS) and transmits the attached field and a receiving side check for errors by confirming whether the extracted result is identical with an extracted result performed by the same method in the receiving side. The CRC is powerful and a hardware configuration thereof is simple. A remainder obtained by dividing an original data frame which is to be transmitted by the transmitting side by a CRC generator polynomial is the FCS. The CRC generator polynomial, which is a divisor for division, is needed to generate the FCS. The FCS is attached to an end of the original data frame so that a result frame (adding the FCS to the original data) can be accurately divided by a predefined polynomial. That is, the FCS calculated for the original data frame is attached to an end of the frame. Here, the predefined polynomial is referred to as the divisor or CRC polynomial.

A receiving side performs CRC after receiving the result frame. The receiving side checks a reminder by dividing a received data frame by the same CRC polynomial used during transmission. The receiving side detects errors by checking whether a remainder obtained by dividing data transmitted together with redundancy by original data is 0. If the remainder is not 0, it is determined that an error has occurred during transmission.

SUMMARY OF THE INVENTION

Still another aspect of the invention relates to a base station for servicing at least one cell in a wireless communications system and adapted for implementing a handover method as outlined above. Such a base station comprises:

In accordance with an aspect of the present invention, a method of transmitting data in a wireless access system, comprising: generating a second input bit sequence by attaching a first error detection code to a first input bit sequence; calculating size B of the second input bit sequence using size A of the first input bit sequence and size L of the first error detection code; if the size B of the second input bit sequence is lager than maximum size Z of code blocks, calculating a number C of the code blocks, using the size B of the second input bit sequence, the maximum size Z of the code blocks, and size L of a second error detection code which is to be attached to each of the code blocks; calculating size B' of a modified second input bit sequence, using the number C of the code blocks, the size L of the second error detection code, and the size B of the second input bit sequence; obtaining the sizes K of the code blocks from predetermined values, based on a value obtained by dividing the size B' of the modified second input bit sequence by the number C of the code blocks; segmenting the second input bit sequence to have the number C of the code blocks and the obtained sizes K of the code blocks; generating the code blocks by attaching the second error detection code to each of the segmented second input bit sequences; and channel-coding the code blocks.

the number C of the code blocks is set to an integer rounding up a value obtained by dividing the size B of the second input bit sequence by the result of subtracting the size L of the second error detection code from the maximum size of the code blocks.

The first and second error detection codes may be 24 bits respectively. Besides, the first and second error detection codes may be generated by different polynomials.

The second error detection code may be additionally attached to detect whether each of the code blocks contains errors.

If the size B of the input bit sequence is less than the maximum size Z of the code blocks, the number C of the code blocks may be set to 1.

The size B' of the modified second input bit sequence may be set to a value obtained by adding the size B of the second input bit sequence to the result of multiplying the number C of the code blocks by the size L of the second error detection code.

The size K of the code blocks desirably satisfies the condition that a value obtained by multiplying the number C of the code blocks by the size K of the code blocks is lager than or equal to the size B' of the modified second input bit sequence.

The size $K_+$ of first code blocks in the size K of the code blocks desirably has the smallest size among the predetermined values, and the size $K_-$ of second code blocks in the size K of the code blocks desirably has the largest size among the predetermined values which are less than the size $K_+$ of the first code blocks.

The number $C_-$ of the second code blocks is set to an integer rounding down a value obtained by dividing, by a difference between the size $K_+$ of the first code blocks and the size $K_-$ of the second code blocks, the result of subtracting the size B' of the modified second input bit sequence from a value obtained by multiplying the number C of the code blocks by the size $K_+$ of the first code blocks.

the number $C_+$ of the first code blocks is obtained by subtracting the number $C_-$ of the second code blocks from the number C of the code blocks.

In accordance with an aspect of the present invention, further comprising: calculating the length F of filler bits by subtracting the size B' of the modified input bit sequence, from the result of adding a value obtained by multiplying the number $C_+$ of the first code blocks by the size $K_+$ of the first code blocks to a value obtained by multiplying the number $C_-$ of the second code blocks by the size $K_-$ of the second code blocks; and allocating the filler bits to a first code block among the code blocks.

In accordance with an aspect of the present invention, further comprising: allocating data to areas except for the size of filler bits and the size of the second error detection code in a first code block of the code blocks; and allocating the data to areas except for the size of the second error detection code in code blocks starting with a second code block.

The step of allocating data to the first code block further comprising attaching the second error detection code to the first code block, and the step of allocating data to the code blocks starting with the second code block further comprising attaching the second error detection code to the code blocks starting with the second code block.

The maximum size Z of the code blocks may be 6144 bits.

The channel-coding the code blocks may be performed by using convolution codes or turbo codes.

In accordance with another aspect of the present invention, a method of transmitting data in a wireless access system, comprising: generating a second input bit sequence by attaching a first error detection code to a first input bit sequence; calculating size B of the second input bit sequence using size A of the first input bit sequence and size L of the first error detection code; if the size B of the second input bit sequence is lager than maximum size Z of code blocks, calculating a number C of the code blocks, using the size B of the second input bit sequence, the maximum size Z of the code blocks, and the size L of a second error detection code which is to be attached to each of the code blocks; calculating size B' of a modified second input bit sequence, using the number C of the code blocks, the size L of the second error detection code, and the size B of the second input bit sequence; obtaining size Kr of the code blocks by dividing the size B' of the modified second input bit sequence by the number C of the code blocks; segmenting the second input bit sequence to have the number C of the code blocks and the obtained size Kr of the code blocks; generating the code blocks by attaching the second error detection code to each of the segmented second input bit sequences; and channel-coding the code blocks.

In accordance with still another aspect of the present invention, a method of transmitting data in a wireless access system, comprising: if size B of an input bit sequence is lager than maximum size Z of code blocks, calculating a number C of the code blocks, using the size B of the input bit sequence, the maximum size Z of the code blocks, and size L of a error detection code which is to be attached to each of the code blocks; calculating size B' of a modified input bit sequence, using the number C of the code blocks, the size L of the error detection code, and the size B of the input bit sequence; obtaining the size K of the code blocks from predetermined values, based on a value obtained by dividing the size B' of the modified input bit sequence by the number C of the code blocks; and segmenting the input bit sequence to have the number C of the code blocks and the size K of the code blocks.

In accordance with still yet another aspect of the present invention, a method of transmitting data in a wireless access system, comprising: generating an input bit sequence by attaching a first error detection code to a transport block; if size B of the input bit sequence is lager than maximum size Z of code blocks, calculating a number C of the code blocks, using the size B of the input bit sequence, the maximum size Z of the code blocks, and size L of a second error detection code which is to be attached to each of the code blocks; calculating size B' of a modified input bit sequence, using the number C of the code blocks, the size L of the second error detection code, and the size B of the input bit sequence; obtaining the size K of the code blocks from predetermined values, based on a value obtained by dividing the size B' of the modified input bit sequence by the number C of the code blocks; segmenting the input bit sequence to have the number C of the code blocks and the size K of the code blocks; generating the code blocks by attaching the second error detection code to each of the segmented input bit sequences; and channel-coding the code blocks.

In accordance with still yet another aspect of the present invention, a method of transmitting data in a wireless access system, comprising: generating an input bit sequence by attaching a first error detection code to a transport block; if size B of the input bit sequence is lager than the maximum size Z of code blocks, calculating a number C of the code blocks, using the size B of the input bit sequence, the maximum size Z of the code blocks, and size L of an error detection code which is to be attached to each of the code blocks; calculating size B' of a modified input bit sequence, using the number C of the code blocks, the size L of the error detection code, and the size B of the input bit sequence; obtaining the size Kr of the code blocks by dividing the size B' of the modified input bit sequence by the number C of the code blocks; and segmenting the input bit sequence to have the number C of the code blocks and the size Kr of the code blocks.

BRIEF DESCRIPTION OF THE DRAWINGS

Other objects, features and advantages of the invention will become apparent when reading the following description on non-limiting exemplary embodiments with reference to the accompanying drawings.

The accompanying drawings, which are included to provide a further understanding of the invention, illustrate embodiments of the invention and together with the description serve to explain the principle of the invention.

In the drawings:

FIG. 1 is a diagram illustrating a process performed in each of a CRC attachment unit and a data block segmentation unit;

FIG. 2 is a diagram illustrating a process of converting a data block into code blocks;

FIG. 3 is a diagram illustrating a process of segmenting a data block in consideration of a CRC size according to an exemplary embodiment of the present invention;

FIG. 4 is a diagram illustrating an example of a process of attaching CRC codes to code blocks according to an exemplary embodiment of the present invention;

FIG. 5 is a diagram illustrating another example of a process of attaching CRC codes to code blocks according to an exemplary embodiment of the present invention;

FIG. 6 is a diagram illustrating a process of segmenting a data block and attaching CRC codes in consideration of a CRC size according to an exemplary embodiment of the present invention;

FIG. 7 is a diagram illustrating a process of converting a data block into code blocks in consideration of a CRC size according to an exemplary embodiment of the present invention;

FIG. 8 is a flow chart illustrating a process of segmenting a data block in consideration of a CRC size according to an exemplary embodiment of the present invention;

FIG. 9 is a flow chart illustrating a process of calculating the number of code blocks according to an exemplary embodiment of the present invention;

FIG. 10 is a flow chart illustrating a process of segmenting a data block using a modified input bit sequence size according to an exemplary embodiment of the present invention; and FIG. 11 is a flow chart illustrating a process of converting a data block into code blocks when the number of code blocks is 1 according to an exemplary embodiment of the present invention.

DETAILED DESCRIPTION OF THE INVENTION

Figure 1:
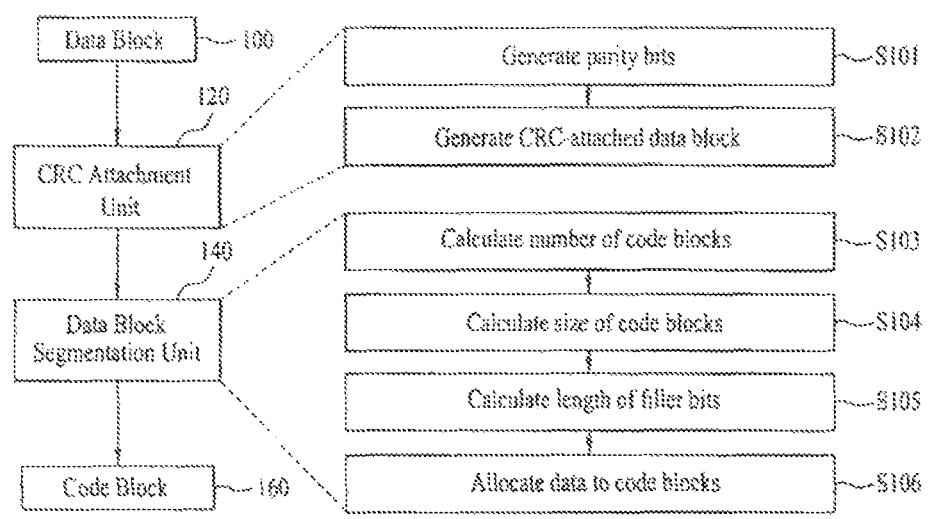

In a generally used CRC attachment method and data block segmentation method, one CRC code is attached to a data block and then the data block is segmented, thereby transmitting the data block in the form of code blocks. In this case, a receiving side receives all the segmented blocks and sequentially combines the code blocks. The receiving side may determine whether the restored data block contains errors through CRC. Therefore, since a determination as to whether the restored data block contains errors is made after all the code blocks are sequentially restored, errors may not be rapidly detected.

Further, if an error is present at any location of the received data block, an error restoration process performed by the receiving side becomes complicated as the number of code blocks is increased.

Furthermore, a CRC code attached to each code block should be considered to calculate the number and size of code blocks. However, a method of calculating the number and size of code blocks by a generally used data block segmentation unit does not consider that the CRC code is attached to each code block.

The present invention devised to solve these problems provides an efficient data transmission method.

An object of the present invention is to provide various methods of segmenting a data block considering the size of an error detection code attached to each code block.

Another object of the present invention is to provide various methods of calculating the number of code blocks.

Still another object of the present invention is to provide various methods of allocating data in consideration of the number and size of code blocks, and/or the size of error detection codes.

A further object of the present invention is to provide an efficient data transmission method based on the above objects.

The present invention provide a method of transmitting data and segmenting a code block in a wireless access system, especially a method of segmenting a data block in consideration of the size of error detection codes and a method of obtaining the number of code blocks.

Exemplary embodiments described hereinbelow are combinations of elements and features of the present invention. The elements or features may be considered as selective ones unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions of any one embodiment may be included in another embodiment and may be replaced with corresponding constructions of another embodiment.

In the following description of the present invention, a detailed description of known procedures or steps will be omitted when it may obscure the subject matter of the present invention.

In exemplary embodiments of the present invention, a description is made of a data transmission and reception relationship between a base station and a mobile station. Here, the term 'base station' refers to a terminal node of a network communicating directly with the mobile station. In some cases, a specific operation described as performed by the base station may be performed by an upper node of the base station.

Namely, it is apparent that, in a network comprised of a plurality of network nodes including a base station, various operations performed for communication with a mobile station may be performed by the base station or other network nodes except for the base station. The term 'base station' may be replaced with the term 'fixed station', 'Node B', 'eNode B' (eNB), 'access point', etc. The term 'mobile station (MS)' may be replaced with the term 'terminal', 'user equipment' (UE), 'mobile subscriber station' (MSS), etc.

Furthermore, the term 'transmitting side' means a node transmitting a data or voice service, and the term 'receiving side' means a node receiving the data or voice service. Therefore, in uplink, the mobile station may be the transmitting side and the base station may be the receiving side. Similarly, in downlink, the mobile station may be the receiving side and the base station may be the transmitting side.

Meanwhile, the mobile station may include a personal digital assistant (PDA), a cellular phone, a personal communication service (PCS) phone, a global system for mobile (GSM) phone, wideband code division multiple access (WCDMA) phone, a mobile broadband system (MBS) phone, etc.

Embodiments of the present invention may be achieved by various means, for example, hardware, firmware, software, or a combination thereof.

In a hardware configuration, a method according to exemplary embodiments of the present invention may be achieved by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

In a firmware or software configuration, a method according to exemplary embodiments of the present invention may be achieved by a module, a procedure, a function, etc. performing the above-described functions or operations. A software code may be stored in a memory unit and driven by a processor. The memory unit is located at the interior or exterior of the processor and may transmit and receive data with the processor via various known means.

Embodiments of the present invention may be supported by documents disclosed in at least one of wireless access systems (for example, IEEE 802 system, 3GPP system, 3GPP LTE system, and 3GPP2 system). Especially, documents disclosed in 3GPP TS 36.212 V8.0.0 (2007-09) to 3GPP TS 36.212 V8.3.0 (2008-05) may support embodiments of the present invention.

The following detailed description includes specific terms in order to provide a thorough understanding of the present invention. However, those specific terms may be modified without departing from the spirit and scope of the present invention.

FIG. 1 is a diagram illustrating a process performed in each of a CRC attachment unit and a data block segmentation unit.

A generally used CRC attachment unit and data block segmentation unit will now be described with reference to FIG. 1. A data block 100 may be segmented into multiple code blocks when necessary. A code block 160 is generated by segmentation of the data block 100.

If a user inputs the data block 100, a CRC attachment unit 120 attaches a CRC code to the data block 100. The data block including the CRC code is divided into a necessary length of data blocks by a data block segmentation unit 140 and constitutes the code block 160 having one or more lengths. This process is sequentially shown in the right side of FIG. 1.

The CRC attachment unit 120 attaches a CRC code to the data block having a prescribed length so that a receiving side can use the data block 100 to detect an error. To this end, the CRC attachment unit 120 generates CRC parity bits of a prescribed length using a CRC generating equation based on the input data block (step S101). Next, the CRC attachment unit 120 forwardly or backwardly attaches the CRC parity bits to a forward data block to generate a serially connected form of data block (step S102).

The CRC-attached data block is segmented into one or multiple code blocks by the data block segmentation unit 140. The data block segmentation unit 140 segments the input data block into one or more code blocks through the following four processes.

The data block segmentation unit 140 sets the number of code blocks to an integer rounding up the result of dividing the size of the CRC-attached data block by a maximum allowed size of the code block (step S103).

The data block segmentation unit 140 calculates the size of each code block according to the number of the code blocks determined in step S103 (step S104).

In step S104, the sum of adding the size of each of the code blocks may be larger than the size of the CRC-attached data block. In this case, a value obtained by subtracting the size of the CRC-attached data block from the size of all the code blocks is set to the length of filler bits (step S105).

If the number and size of code blocks and the length of the filler bits are determined, the data block segmentation unit 140 segments the CRC-attached data block and allocates data to each code block (step S106). In step S106, the filler bits and data are sequentially allocated to the beginning of the first block among the code blocks and the next data is sequentially allocated starting with the second block.

Figure 2:
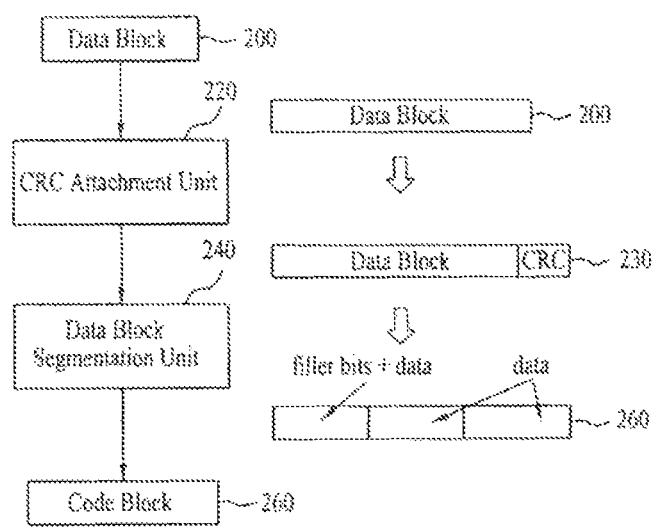

FIG. 2 is a diagram illustrating a process of converting a data block into code blocks.

In FIG. 2, the units and method used in FIG. 1 may be employed.

Referring to FIG. 2, a data block 200 is input to a CRC attachment unit 220. CRC bits are attached to the data block 200 by the CRC attachment unit 220 to generate a CRC-attached data block 230. The CRC-attached data block is input to a data block segmentation unit 240 and then segmented into code blocks. Filler bits are attached to the beginning of the first block of a code block 260 and data is allocated to the other part thereof. The data is sequentially allocated starting with a second code block.

In exemplary embodiments of the present invention, it is assumed that CRC codes are used as one type of desirable error detection codes which can be attached to the code blocks by the data block segmentation unit. Moreover, the term 'data block' is input bits which are input to the data block segmentation unit and may be referred to as a first data block. If segmentation of the input bits is performed, a code block or a second data block is generated.

First Embodiment

Figure 3:
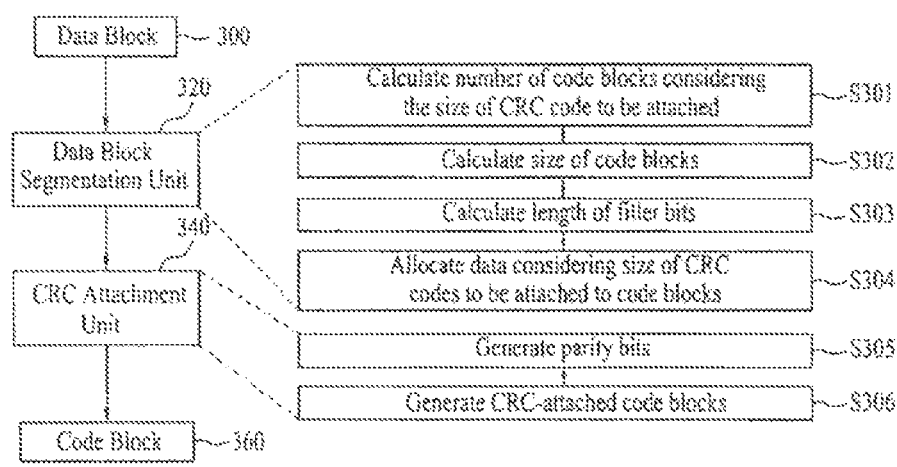

FIG. 3 is a diagram illustrating a process of segmenting a data block in consideration of a CRC size according to an exemplary embodiment of the present invention.

Referring to FIG. 3, a data block (for example, a first data block 300) is input to a data block segmentation unit 320 and segmented into one or more code blocks (for example, a second data block). Data is sequentially allocated to the code blocks. The code blocks are input to a CRC attachment unit 340. In this case, the data block may include an error detection code therein and the size of the error detection code is desirably 24 bits.

The CRC attachment unit 340 generates CRC codes and attaches the CRC codes to the code blocks, except when the data block is comprised of one code block including an error detection code (for example, except when a data block size B is less than or equal to a maximum code block size Z). Thus the data block 300 is segmented into the code block 360 through the data block segmentation unit 320 and the CRC attachment unit 340. In FIG. 3, the code block 360 means one or more segmented data blocks.

Referring to FIG. 3, if the data block 300 is input to the data block segmentation unit 320, the data block segmentation unit 320 calculates the number C of code blocks with respect to input data. In this case, the data block segmentation unit 320 may calculate the number C of code blocks in consideration of the size L of a CRC code which is to be attached to each of final code blocks (step S301).

Hereinafter, various methods of calculating the number C of code blocks used in step S301 will be described.

A first method of calculating the number of code blocks in step S301 according to an exemplary embodiment of the present invention will now be described.

The following Equation 1 illustrates an example of calculating the number C of code blocks.

[Equation 1]

$$C' = \lceil B/Z \rceil; \lceil x \rceil \text{ is an integer rounding up } x$$
$$\text{if } C' * L + B > C' * Z$$
$$\quad C = C' + 1$$
$$\text{else}$$
$$\quad C = C'$$
$$\text{end}$$

The data block segmentation unit 320 sets, to a temporal value C', an integer rounding up a value obtained by dividing the data block size B by the maximum code block size Z. If a value obtained by adding the data block size B to the result of multiplying the temporal value C' by the CRC size L is greater than a value obtained by multiplying the temporal value C' by the maximum code block size Z, the number C of code blocks is set to a value obtained by adding 1 to the temporal value C', and if not, the number C of code blocks is set to the temporal value C'.

Meanwhile, Equation 2 shown below may be used when the data block size B input to the data block segmentation unit is less than or equal to the maximum code block size Z.

[Equation 2]

$$\text{if } B \leq Z$$
$$\quad C = 1$$
$$\text{else}$$
$$\quad C' = \lceil B/Z \rceil$$
$$\quad \text{If } C' * L + B > C' * Z$$
$$\quad\quad C = C' + 1$$
$$\quad \text{else}$$
$$\quad\quad C = C'$$
$$\quad \text{end}$$
$$\text{end}$$

Equation 1 and Equation 2 use the temporal value C' to calculate the number C of code blocks. That is, the number of code blocks can be accurately calculated by acquiring the temporal value obtained by rounding up the result of dividing the size of the data block input to the data block segmentation unit 320 by the maximum code block size.

Other forms of Equation 1 and Equation 2 are illustrated in Equation 3 and Equation 4. Namely, the number of code blocks is directly calculated without using the temporal value C'.

[Equation 3]

$$\text{if } \lceil B/Z \rceil * L + B > \lceil B/Z \rceil * Z$$
$$\quad C = \lceil B/Z \rceil + 1$$
$$\text{else}$$
$$\quad C = \lceil B/Z \rceil$$
$$\text{end}$$

Meanwhile, the following Equation 4 may be used when the size B of the data block input to the data block segmentation unit is less than or equal to the maximum code block size Z.

[Equation 4]

$$\text{If } B \leq Z$$
$$\quad C = 1$$
$$\text{else}$$
$$\quad \text{if } \lceil B/Z \rceil * L + B > \lceil B/Z \rceil * Z$$
$$\quad\quad C = \lceil B/Z \rceil + 1$$
$$\quad \text{else}$$
$$\quad\quad C = \lceil B/Z \rceil$$
$$\quad \text{end}$$
$$\text{end}$$

A second method of calculating the number of code blocks in the above-described step S301 according to the exemplary embodiment of the present invention will now be described.

The following Equation 5 illustrates a method of calculating the number C of code blocks using a modified input bit sequence size B'.

[Equation 5]

$$\text{if } \lceil B/Z \rceil * L + B > \lceil B/Z \rceil * Z$$
$$\quad B' = B + (\lceil B/Z \rceil + 1) * L$$
$$\text{else}$$
$$\quad B' = B + \lceil B/Z \rceil * L$$
$$\text{end}$$
$$C = \lceil B'/Z \rceil$$

In Equation 5, the modified input bit sequence size B' is calculated to obtain the number of code blocks. It is assumed that a value, obtained by rounding up the result of dividing data block size B by the maximum code block size Z, times the CRC size L plus the data block size B is 'M'. It is also assumed that a value, obtained by rounding up the result of dividing the data block size B by the maximum code block size Z, times the maximum code block size Z is 'N'.

If M is larger than N, the modified input bit sequence size B' for calculating the number C and size K of code blocks assumes a value obtained by rounding up the result of dividing the data block size B by the maximum code block size Z, plus 1 times the CRC size L plus the data block size B.

If M is less than N, the modified input bit sequence size B' assumes a value rounding up the result of dividing the data block size B by the maximum code block size Z, times the CRC size L plus the data block size B.

Therefore, the number C of code blocks is set to an integer obtained by rounding up the result of diving the modified input bit sequence size B' for calculating the number C of code blocks and code block size K by the maximum code block size Z.

Meanwhile, when the data block size B input to the data block segmentation unit is less than or equal to the maximum code block size Z, the following Equation 6 is used.

[Equation 6]

$$\begin{aligned}&\text{if } B \leq Z \\ &\quad B' = B \\ &\text{else} \\ &\quad \text{if } \lceil B/Z \rceil * L + B > \lceil B/Z \rceil * Z \\ &\quad\quad B' = B + (\lceil B/Z \rceil + 1) * L \\ &\quad \text{else} \\ &\quad\quad B' = B + \lceil B/Z \rceil * L \\ &\quad \text{end} \\ &\text{end} \\ &C = \lceil B'/Z \rceil\end{aligned}$$

Equation 5 and Equation 6 show a method of calculating the number C of code blocks using the modified input bit sequence size B' without using the temporal value C' unlike Equation 1 and Equation 2. That is, the number C of code blocks can be obtained by using the modified input bit sequence size B'.

A third method of calculating the number of code blocks in step S301 according to the exemplary embodiment of the present invention will now be described.

The following Equation 7 illustrates another example of calculating the number C of code blocks.

$$C = \lceil B/(Z-L) \rceil \quad \text{[Equation 7]}$$

The number C of code blocks may be set to an integer rounding up the result of dividing the data block size B by a value obtained by subtracting the CRC size L from the maximum code block size Z.

Meanwhile, if the data block size B input to the data block segmentation unit is equal to or less than the maximum code block size Z, the following Equation 8 may be used.

[Equation 8]

$$\begin{aligned}&\text{If } B \leq Z \\ &\quad C = 1 \\ &\text{else} \\ &\quad C = \lceil B/(Z-L) \rceil \\ &\text{end}\end{aligned}$$

Equation 7 and Equation 8 illustrate a method of calculating the number C of code blocks in consideration of the CRC size L for each code block. That is, the CRC size L may be considered when segmenting the data block size B, by dividing the data block size B by a value obtained by subtracting the CRC size L from the maximum code block size Z. In Consequence, segmentation of the data block can be accurately performed according to user requirements.

A fourth method of calculating the number C of code blocks in step S301 according to the exemplary embodiment of the present invention will now be described.

Equation 9 shown below illustrates the case where the maximum code block size Z is variable.

$$Z' = Z - a$$

$$C = \lceil B/Z' \rceil \quad \text{[Equation 9]}$$

The data segmentation unit may set the number C of code blocks to an integer rounding up the result of dividing the data block size B by a value Z' which is less than the maximum code block size Z by 'a' (where 'a' is a natural number). Here, 'a' may be a necessary size according to the CRC size L or system environments.

Meanwhile, if the data block (or input bit) size B is less than the maximum code block size Z, the following Equation 10 may be used.

[Equation 10]

$$\begin{aligned}&\text{if } B \leq Z \\ &\quad C = 1 \\ &\text{else} \\ &\quad Z' = Z - a \\ &\quad C = \lceil B/Z' \rceil \\ &\text{end}\end{aligned}$$

A fifth method of calculating the number of code blocks in step S301 according to the exemplary embodiment of the present invention will now be described.

The data segmentation unit replaces the maximum code block size Z with a specific value x and sets the number C of code blocks to an integer rounding up the result of dividing the data block size B by the specific value x.

The following Equation 11 illustrates an example of calculating the number C of code blocks.

$$Z = x$$

$$C = \lceil B/Z \rceil \quad \text{[Equation 11]}$$

Meanwhile, if the data block (or input bit) size B input to the data block is less than or equal to the maximum code block size Z, Equation 12 may be used.

[Equation 12]

$$\begin{aligned}&\text{if } B \leq Z \\ &\quad C = 1 \\ &\text{else} \\ &\quad Z = x \\ &\quad C = \lceil B/Z \rceil \\ &\text{end}\end{aligned}$$

Equation 11 and Equation 12 may be used when the maximum code block size Z is variable. That is, since the maximum code block size may be changed according to system environments, Equation 11 and Equation 12 are flexibly used.

Referring back to FIG. 3, if the number C of code blocks is determined in step S301, the size of each code block and the number of code blocks having a specific length are calculated by using at least one of the number C of code blocks and the modified input bit sequence size B' (step S302).

Hereinafter, various methods for calculating a code block size K in step S302 according to an exemplary embodiment of the present invention will be described.

The code block size K may have various sizes according to system requirements. In the exemplary embodiment of the present invention, the cases are assumed where each code block size K is constant, or has sizes K+ and K−. However, it is apparent that various sizes of code blocks may be used. In exemplary embodiments of the present invention, the code block is segmented from the data block (or input bit) and may be referred to as a segment.

A first method of calculating the code block size K when the size of each code block is the same in step S302 will now be described.

Equation 13 illustrates an example of calculating the code block size K when the size of each code block is constant.

$$K = \lceil B'/C \rceil \quad \text{[Equation 13]}$$

Equation 13 show a calculating method for the code block size K when the size of each code block is constant. That is, the code block size K is set to an integer rounding up the result of dividing the modified input bit size B' by the number C of code blocks. In this case, the modified input bit size B' is a temporal value for obtaining the number and size of code blocks.

If the modified input bit size B' for calculating the number and size of code blocks is not calculated in step S301, a value, (C×L+B), obtained by multiplying the number C of code blocks by the CRC size L and then adding the data block size B to the multiplied result may be used as the modified input bit size B.

A second method of calculating a first code block size $K_+$ when the code block size k has a specific size $K_+$ or K− in step S302 will now be described.

Equation 14 illustrates an example of calculating the first code block size $K_+$.

$K_+$ is a minimum value of K, where K satisfies
$C*K \geq B+C*L$ or $C*K \geq B'$  [Equation 14]

A code block having the size $K_+$ uses a value K in Table 1 shown below. In this case, a condition of the value K is that the result of multiplying the number C of code blocks by K is larger than or equal to a value obtained by adding the input sequence size B to the result of multiplying the number C of code blocks by the CRC size L. Another condition of the value K is that the result of multiplying the number C of code blocks by K is larger than or equal to the modified input bit size B'. Namely, the value $K_+$ may have a minimum value among values K satisfying any one of two conditions of Equation 14.

If the code block size is calculated using the method as illustrated in Equation 14, since the code block size is obtained considering the CRC size L, the input data block (or input bit) can be accurately divided into desired lengths.

Equation 15 illustrates another example of calculating the first code block size K+.

$K_+$ is a minimum value of K, where K satisfies $C*(K-L) \geq B'$  [Equation 15]

In Equation 15, the code block having the size K+ uses a minimum value of K satisfying the following condition in Table 1. That is, the smallest value is used as $K_+$ among the values K satisfying a condition that a value obtained by multiplying the number C of code blocks by the result of subtracting the CRC size L from K is larger than or equal to the modified input bit size B'.

The following Equation 16 may be used when the modified input bit size B' in Equation 15 is set to a value obtained by adding the input bit size B to the result of multiplying the number C of code blocks by the CRC size L.

$K_+$ is a minimum value of K, where K satisfies $C*(K-L) \geq B+C*L$  [Equation 16]

In Equation 16, a code block having the size $K_+$ may use the value K shown in Table 1.

The following Table 1 illustrates parameters for the value K which may be used in Equation 13 to Equation 16.

TABLE 1

| i | $K_i$ | $f_1$ | $f_2$ |
|---|---|---|---|
| 1 | 40 | 3 | 10 |
| 2 | 48 | 7 | 12 |
| 3 | 56 | 19 | 42 |
| 4 | 64 | 7 | 16 |
| 5 | 72 | 7 | 18 |
| 6 | 80 | 11 | 20 |
| 7 | 88 | 5 | 22 |
| 8 | 96 | 11 | 24 |
| 9 | 104 | 7 | 26 |
| 10 | 112 | 41 | 84 |
| 11 | 120 | 103 | 90 |
| 12 | 128 | 15 | 32 |
| 13 | 136 | 9 | 34 |
| 14 | 144 | 17 | 108 |
| 15 | 152 | 9 | 38 |
| 16 | 160 | 21 | 120 |
| 17 | 168 | 101 | 84 |
| 18 | 176 | 21 | 44 |
| 19 | 184 | 57 | 46 |
| 20 | 192 | 23 | 48 |
| 21 | 200 | 13 | 50 |
| 22 | 208 | 27 | 52 |
| 23 | 216 | 11 | 36 |
| 24 | 224 | 27 | 56 |
| 25 | 232 | 85 | 58 |
| 26 | 240 | 29 | 60 |
| 27 | 248 | 33 | 62 |
| 28 | 256 | 15 | 32 |
| 29 | 264 | 17 | 198 |
| 30 | 272 | 33 | 68 |
| 31 | 280 | 103 | 210 |
| 32 | 288 | 19 | 36 |
| 33 | 296 | 19 | 74 |
| 34 | 304 | 37 | 76 |
| 35 | 312 | 19 | 78 |
| 36 | 320 | 21 | 120 |
| 37 | 328 | 21 | 82 |
| 38 | 336 | 115 | 84 |
| 39 | 344 | 193 | 86 |
| 40 | 352 | 21 | 44 |
| 41 | 360 | 133 | 90 |
| 42 | 368 | 81 | 46 |
| 43 | 376 | 45 | 94 |
| 44 | 384 | 23 | 48 |
| 45 | 392 | 243 | 98 |
| 46 | 400 | 151 | 40 |
| 47 | 408 | 155 | 102 |
| 48 | 416 | 25 | 52 |
| 49 | 424 | 51 | 106 |
| 50 | 432 | 47 | 72 |
| 51 | 440 | 91 | 110 |
| 52 | 448 | 29 | 168 |
| 53 | 456 | 29 | 114 |
| 54 | 464 | 247 | 58 |
| 55 | 472 | 29 | 118 |
| 56 | 480 | 89 | 180 |
| 57 | 488 | 91 | 122 |
| 58 | 496 | 157 | 62 |
| 59 | 504 | 55 | 84 |
| 60 | 512 | 31 | 64 |
| 61 | 528 | 17 | 66 |
| 62 | 544 | 35 | 68 |
| 63 | 560 | 227 | 420 |
| 64 | 576 | 65 | 96 |
| 65 | 592 | 19 | 74 |
| 66 | 608 | 37 | 76 |
| 67 | 624 | 41 | 234 |
| 68 | 640 | 39 | 80 |
| 69 | 656 | 185 | 82 |
| 70 | 672 | 43 | 252 |
| 71 | 688 | 21 | 86 |
| 72 | 704 | 155 | 44 |
| 73 | 720 | 79 | 120 |
| 74 | 736 | 139 | 92 |
| 75 | 752 | 23 | 94 |
| 76 | 768 | 217 | 48 |
| 77 | 784 | 25 | 98 |
| 78 | 800 | 17 | 80 |
| 79 | 816 | 127 | 102 |
| 80 | 832 | 25 | 52 |
| 81 | 848 | 239 | 106 |
| 82 | 864 | 17 | 48 |
| 83 | 880 | 137 | 110 |
| 84 | 896 | 215 | 112 |
| 85 | 912 | 29 | 114 |
| 86 | 928 | 15 | 58 |
| 87 | 944 | 147 | 118 |
| 88 | 960 | 29 | 60 |
| 89 | 976 | 59 | 122 |

TABLE 1-continued

| i | $K_i$ | $f_1$ | $f_2$ |
|---|---|---|---|
| 90 | 992 | 65 | 124 |
| 91 | 1008 | 55 | 84 |
| 92 | 1024 | 31 | 64 |
| 93 | 1056 | 17 | 66 |
| 94 | 1088 | 171 | 204 |
| 95 | 1120 | 67 | 140 |
| 96 | 1152 | 35 | 72 |
| 97 | 1184 | 19 | 74 |
| 98 | 1216 | 39 | 76 |
| 99 | 1248 | 19 | 78 |
| 100 | 1280 | 199 | 240 |
| 101 | 1312 | 21 | 82 |
| 102 | 1344 | 211 | 252 |
| 103 | 1376 | 21 | 86 |
| 104 | 1408 | 43 | 88 |
| 105 | 1440 | 149 | 60 |
| 106 | 1472 | 45 | 92 |
| 107 | 1504 | 49 | 846 |
| 108 | 1536 | 71 | 48 |
| 109 | 1568 | 13 | 28 |
| 110 | 1600 | 17 | 80 |
| 111 | 1632 | 25 | 102 |
| 112 | 1664 | 183 | 104 |
| 113 | 1696 | 55 | 954 |
| 114 | 1728 | 127 | 96 |
| 115 | 1760 | 27 | 110 |
| 116 | 1792 | 29 | 112 |
| 117 | 1824 | 29 | 114 |
| 118 | 1856 | 57 | 116 |
| 119 | 1888 | 45 | 354 |
| 120 | 1920 | 31 | 120 |
| 121 | 1952 | 59 | 610 |
| 122 | 1984 | 185 | 124 |
| 123 | 2016 | 113 | 420 |
| 124 | 2048 | 31 | 64 |
| 125 | 2112 | 17 | 66 |
| 126 | 2176 | 171 | 136 |
| 127 | 2240 | 209 | 420 |
| 128 | 2304 | 253 | 216 |
| 129 | 2368 | 367 | 444 |
| 130 | 2432 | 265 | 456 |
| 131 | 2496 | 181 | 468 |
| 132 | 2560 | 39 | 80 |
| 133 | 2624 | 27 | 164 |
| 134 | 2688 | 127 | 504 |
| 135 | 2752 | 143 | 172 |
| 136 | 2816 | 43 | 88 |
| 137 | 2880 | 29 | 300 |
| 138 | 2944 | 45 | 92 |
| 139 | 3008 | 157 | 188 |
| 140 | 3072 | 47 | 96 |
| 141 | 3136 | 13 | 28 |
| 142 | 3200 | 111 | 240 |
| 143 | 3264 | 443 | 204 |
| 144 | 3328 | 51 | 104 |
| 145 | 3392 | 51 | 212 |
| 146 | 3456 | 451 | 192 |
| 147 | 3520 | 257 | 220 |
| 148 | 3584 | 57 | 336 |
| 149 | 3648 | 313 | 228 |
| 150 | 3712 | 271 | 232 |
| 151 | 3776 | 179 | 236 |
| 152 | 3840 | 331 | 120 |
| 153 | 3904 | 363 | 244 |
| 154 | 3968 | 375 | 248 |
| 155 | 4032 | 127 | 168 |
| 156 | 4096 | 31 | 64 |
| 157 | 4160 | 33 | 130 |
| 158 | 4224 | 43 | 264 |
| 159 | 4288 | 33 | 134 |
| 160 | 4352 | 477 | 408 |
| 161 | 4416 | 35 | 138 |
| 162 | 4480 | 233 | 280 |
| 163 | 4544 | 357 | 142 |
| 164 | 4608 | 337 | 480 |
| 165 | 4672 | 37 | 146 |
| 166 | 4736 | 71 | 444 |
| 167 | 4800 | 71 | 120 |
| 168 | 4864 | 37 | 152 |
| 169 | 4928 | 39 | 462 |
| 170 | 4992 | 127 | 234 |
| 171 | 5056 | 39 | 158 |
| 172 | 5120 | 39 | 80 |
| 173 | 5184 | 31 | 96 |
| 174 | 5248 | 113 | 902 |
| 175 | 5312 | 41 | 166 |
| 176 | 5376 | 251 | 336 |
| 177 | 5440 | 43 | 170 |
| 178 | 5504 | 21 | 86 |
| 179 | 5568 | 43 | 174 |
| 180 | 5632 | 45 | 176 |
| 181 | 5696 | 45 | 178 |
| 182 | 5760 | 161 | 120 |
| 183 | 5824 | 89 | 182 |
| 184 | 5888 | 323 | 184 |
| 185 | 5952 | 47 | 186 |
| 186 | 6016 | 23 | 94 |
| 187 | 6080 | 47 | 190 |
| 188 | 6144 | 263 | 480 |

In Table 1, parameters $f_1$ and $f_2$ may be varied according to the value K which is an input data size.

A third method of calculating a code block size K− when the code block size K has a specific size $K_+$ or $K_-$ in step S302 will now be described.

The value $K_-$ may be set to a maximum value among values K which are less than $K_+$ calculated in any one of Equation 14 to Equation 16. The value K may use values shown in Table 1. The following Equation 17 illustrates a method of calculating the value K.

$$K_- \text{ is a minimum value of } K, \text{ where } K \text{ satisfies } K < K_+ \quad \text{[Equation 17]}$$

When calculating K− using values shown in Table 1 and Equation 17, segmentation of the input data block (or input bit) can be accurately performed in consideration of the size of a code block to which a CRC code is attached.

A description has been made of a method of calculating the code block sizes $K_+$ and $K_-$ when the size of the code block has a specific size through Equation 14 to Equation 17. In this case, it is necessary to obtain the numbers $C_+$ and $C_-$ of code blocks having the code block sizes $K_+$ and $K_-$, respectively, to accurately divide the input data block.

Hereinafter, methods of calculating the number $C_-$ of code blocks having the specific size $K_-$ in step S302 will be described.

Equation 18 illustrates a first method of calculating the number $C_-$ of second code blocks having the size $K_-$.

$$C_- = \left\lfloor \frac{C \cdot K_+ - B'}{\Delta_K} \right\rfloor \quad \text{[Equation 18]}$$

The number $C_-$ of second code blocks may be calculated by an integer rounding down the result of dividing a value of the total number C of code blocks times the first code block size $K_+$ minus the modified input bit sequence size B' by a difference value $\Delta K$ between $K_+$ and $K_-$. The modified input bit sequence size B' is a temporal value for calculating the number and size of code blocks.

In Equation 18, the number $C_-$ of code blocks having the size $K_-$ is calculated using the modified input bit sequence size B'. Therefore, segmentation of the input data block sequence (or input bit) can be accurately performed in consideration of the CRC size L included in each code block.

Equation 18 may be expressed by the following Equation 19.

$$C_- = \left\lfloor \frac{C \cdot K_+ - (B + C \cdot L)}{\Delta_K} \right\rfloor \quad \text{[Equation 19]}$$

Equation 19 shows that the modified input bit sequence size B' is set to a value obtained by multiplying the number C of code blocks by the CRC size L and then adding the data block size B to the multiplied result.

A second method of calculating the number $C_-$ of code blocks having the second code block size $K_-$ in step S302 will now be described.

Equation 20 illustrates an example of calculating the number $C_-$ of second code blocks having the size K.

$$C_- = \left\lfloor \frac{C \cdot (K_+ - L) - B'}{D} \right\rfloor \quad \text{[Equation 20]}$$

The number $C_-$ of second code blocks may be calculated by an integer rounding down the result of dividing a value of $C*(K_+-L)-B'$ by a difference D between $K_+$ and $K_-$.

That is, Equation 20 shows a method of calculating the number $C_-$ of second code blocks considering the CRC size L to be included in the first code block.

Equation 21 illustrates an example of expressing Equation 20 using the modified input bit sequence size B'. That is, the modified input bit sequence size B' is set to a value obtained by adding the data block size B to the result of multiplying the number C of code blocks by the CRC size L.

$$C_- = \left\lfloor \frac{C \cdot (K_+ - L) - (B + C \cdot L)}{D} \right\rfloor \quad \text{[Equation 21]}$$

A method of calculating the number $C_+$ of first code blocks having the specific size $K_+$ in step S302 is as follows.

$$C_+ = C - C_- \quad \text{[Equation 22]}$$

In Equation 22, the number $C_+$ of first code blocks having the specific size $K_+$ is calculated by subtracting the number $C_-$ of second code blocks calculated in Equation 19 to Equation 21 from the total number C of code blocks.

Referring back to FIG. 3, the size of each code block calculated in step S302 may be fixed or each code block may have a specific size $K_+$ or $K_-$. The data block size K may be determined according to system requirements.

In dividing the data block, a value obtained by adding the sizes of all code blocks may be larger than the modified input bit sequence size B' for calculating the number C of code blocks and the code block size K. In this case, a length F of filler bits corresponding to a difference between the value obtained by adding the sizes of all code blocks and the modified input bit sequence size B' is calculated (step S303).

The filler bits serve to equalize an initially input data block with the sizes of code blocks when an error detection code is attached to the code blocks segmented from the data block. If the code block number is 0, the filler bit length F is also 0.

Methods of calculating the filler bit length F will now be described.

The filler bit length F may be calculated by subtracting the modified input bit sequence size B' from the result of multiplying the number C of code blocks by the code block size K.

The following Equation 23 illustrates a first method of calculating the filler bit length F.

$$F = C*K - B' \quad \text{[Equation 23]}$$

Equation 23 shows the method of calculating the filler bit length when the input data block is segmented into code blocks of the same length.

The following Equation 24 expresses Equation 23 using the modified input bit sequence size B'.

$$F = C*K - (B + C*L) \quad \text{[Equation 24]}$$

A second method of calculating the filler bit length F in step S303 is as follows.

Equation 25 illustrates an example of calculating the filler bit length F. Namely, Equation 25 shows a method of calculating the filler bit length when the input data block (or input bit) has a specific size (for example, $K_+$ or $K_-$).

$$F = C_+ * K_+ + C_- * K_- - B' \quad \text{[Equation 25]}$$

The filler bit length F may be calculated by subtracting the modified input bit sequence size B' from the sum of the sizes of all code blocks. That is, the filler bit length F may be calculated by subtracting the modified input bit sequence size B' from a value of $(C_+ \times K_+) + (C_- \times K_-)$.

Using Equation 25, the exemplary embodiments of the present invention may be applied even when the sizes of code blocks segmented from a data block are different. Since the filler bit length can be calculated when an error detection code is included in the code blocks, the code blocks can be accurately generated.

In the following Equation 26, the modified input bit sequence size B' is set to a value obtained by multiplying the error detection code size L by the number C of code blocks and then adding the data block (or input bit) size B to the multiplied result.

$$F = C_+ * K_+ + C_- * K_- - (B + C*L) \quad \text{[Equation 26]}$$

Referring back to FIG. 3, if the number of code blocks, the code block size, and the filler bit length are determined, the data block segmentation unit 320 may sequentially allocate data to code blocks (step S304).

In step S304, if the data block (300) is comprised of one code block including an error detection code, data is allocated to the data block 300 and is not input to the CRC attachment unit 340. This is the case where the size of the data block 300 is less than or equal to the maximum size of the code block 360. Therefore, the data block is segmented by the data block segmentation unit 320 and a step for attaching a CRC code to each segmented code block is omitted. That is, the input data block 300 is directly used as the code block 360. Accordingly, only an initially included CRC code is present in the code block 360 and the CRC code generated from the CRC attachment unit 340 is need not be attached to the code block 360.

If data is allocated to the code blocks, the code blocks are input to the CRC attachment unit 340. The CRC attachment unit 340 generates CRC parity bits of a prescribed length using a CRC generating equation based on the code blocks (step S305).

The CRC attachment unit attaches the CRC parity bits generated in step S305 to a rear part of the code blocks in a forward or backward direction. Finally, CRC-attached code blocks are generated (step S306).

Second Embodiment

Figure 4:
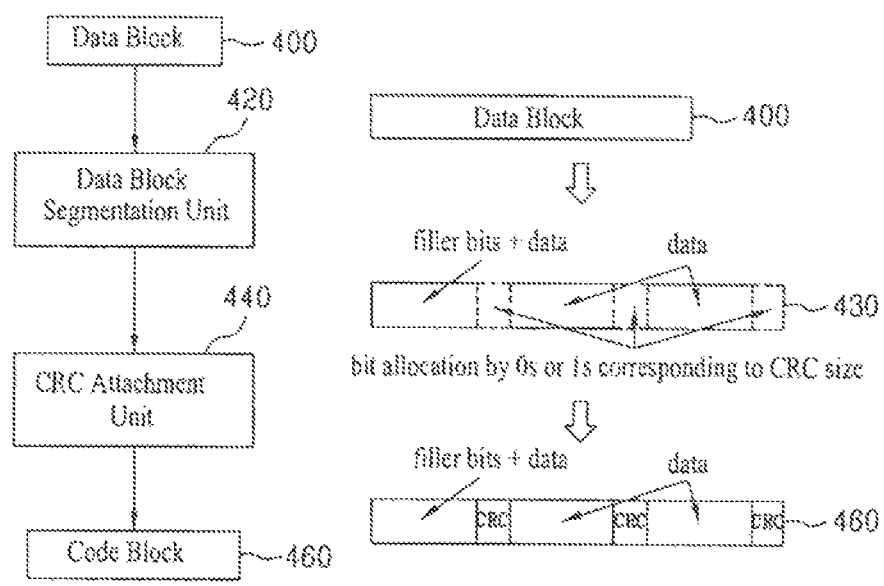

FIG. 4 is a diagram illustrating an example of a process of attaching CRC codes to code blocks according to an exemplary embodiment of the present invention.

Referring to FIG. 4, a data block (a first data block 400) is input to a data block segmentation unit 420 and is segmented into code blocks (a second data block). Code blocks 430 in consideration of a CRC size are input to the CRC attachment unit 440 to generate a CRC-attached code block 460. This process is similar to the method of FIG. 3, except for steps 304 and S306 in FIG. 3.

Another exemplary embodiment of the present invention assumes that the size of the code block 430 input to the CRC attachment unit is equal to the size of the CRC-attached code block 460. That is, a CRC size is included in the size of the code block input to the CRC attachment unit. Accordingly, when calculating the number and size of code blocks with respect to input data, it is desirable for the data block segmentation unit to consider the size of a CRC code to be attached within each code block.

If the number C of code blocks, code block size K, and the filler bit length F are determined, the data block segmentation unit 420 sequentially allocated data to the code blocks. At this time, filler bits and data are allocated to the first block of the code blocks.

In another exemplary embodiment of the present invention, data is allocated to the code blocks in consideration of the CRC size L to be attached in the CRC attachment unit. Therefore, the filler bits and data are allocated to the first code block and a value consisting of 0s or 1s corresponding to the size of the CRC code is allocated to designate a CRC area. However, the value only indicates the CRC area and does not mean that a CRC code is attached to the CRC area.

Data is sequentially allocated starting with the second code block to the last code block. A value consisting of 0s or 1s indicating that a CRC area is allocated in each code block to ensure the CRC area.

The CRC attachment unit attaches CRC codes to the code blocks. In this case, CRC parity bits corresponding to the CRC area filled with 0s or 1s are generated and the CRC parity bits are attached in a forward or backward direction. This process is performed for each code block. The size L of the CRC code may be 24 bits.

Through the above-described method, the data block having a prescribed size is segmented into the CRC-attached code blocks via the data block segmentation unit 420 and the CRC attachment unit 440.

However, if the data block 400 is less than or equal to the maximum code block size, the data block does not pass through the data block segmentation unit 420 and the CRC attachment unit 440. Namely, if the data block 400 is comprised of one code block including a CRC code, since the data block 400 has already included the CRC code, only the data is allocated to the data block 400 and the CRC code is not attached in the CRC attachment unit.

When configuring the code block input to the CRC attachment unit, a detailed example of including the CRC size in the code block is as follows.

Table 2 illustrates a configuration equation of the code block considering the CRC size.

TABLE 2

| Syntax | Value | Notes |
|---|---|---|
| for k = 0 to F−1 | | |
| $O_{0k}$ = 0 or 1 | | |
| end for | | |
| K = F | | |
| S = 0 | | |
| for r = 0 to C−1 | | |
| if r < $C_-$ | | |
| $K_r = K_-$ | | |

TABLE 2-continued

| Syntax | Value | Notes |
|---|---|---|
| Else | | |
| $K_r = K_+$ | | |
| end if | | |
| while (k < $K_r$) | | |
| if(k < $K_r$ − L) | | |
| $O_{rk} = b_s$ | | |
| s = s + 1 | | |
| Else | | |
| $O_{rk}$ = 0 or 1 | | |
| end if | | |
| k = k + 1 | | |
| end while | | |
| k = 0 | | |
| end for | | |

Table 3 illustrates a configuration equation of the code block considering the CRC size when the data block is comprised of one code block including an error detection code.

TABLE 3

| Syntax | Value | Notes |
|---|---|---|
| if C = 1 | | |
| L = 0 | | |
| end if | | |
| for k = 0 to F−1 | | |
| $O_{0k}$ = 0 or 1 | | |
| end for | | |
| K = F | | |
| S = 0 | | |
| for r = 0 to C−1 | | |
| if r < $C_-$ | | |
| $K_r = K_-$ | | |
| Else | | |
| $K_r = K_+$ | | |
| end if | | |
| while(k < $K_r$) | | |
| if(k < $K_r$−L) | | |
| $O_{rk} = b_s$ | | |
| s = s + 1 | | |
| Else | | |
| $O_{rk}$ = 0 or 1 | | |
| end if | | |
| k = k + 1 | | |
| end while | | |
| k = 0 | | |
| end for | | |

Principal parameters used in Table 2 and Table 3 are as follows. A parameter 'F' indicates the length of filler bits, '$O_{rk}$' indicates an output of a data block segmentation unit, 'r' indicates a code block number, and 'k' indicates a bit number of the rth block.

It is assumed that the code block size is $K_+$ and $K_-$ (where $K_-$ is less than $K_+$). Parameters $C_+$ and $C_-$ indicate the numbers of specific code blocks, that is, the numbers of code blocks having the sizes $K_+$ and $K_-$, respectively. A parameter 'L' shown in Table 2 and Table 3 indicates the size of a CRC code to be attached to each code block and 'Kr' indicates a size to be applied to a code block.

An example of attaching a CRC code to each code block generated in consideration of a CRC size is illustrated in Equation.

$O_{rk} = O_{rk}; k = 0, 1, 2, \ldots, K_r - L - 1$ $O_{rk} = P_{r(K_r - k - 1)}; k = K_r - L, K_r - L + 1, K_r - L + 2, \ldots, K_r - 1$
$(= K_r - L + L - 1)$ [Equation 27]

When the data block size B is less than the maximum code block size Z, an example of attaching a CRC code to each code block generated considering the CRC size L is illustrated in Equation 28.

[Equation 28]

```
if C = 1
    bypass
else
    O_{rk} = O_{rk}; k = 0, 1, 2, ..., K_r-L-1
    O_{rk} = P_{r(Kr-k-1)}; k = K_r-L, K_r-L+1, K_r-L+2, ..., K_r-1(=K_r-L+L-1)
end if
```

In calculating parameters for CRC attachment, it is assumed that a size applied to the code block is Kr and a CRC size attached to each code block is L. Input bits may be denoted by $O_{r0}, O_{r1}, O_{r2}, \ldots, O_{rKr-1}$. CRC parity bits may be denoted by $p_{r0}, p_{r1}, p_{r2}, \ldots, p_{rL-1}$. The CRC parity bits may be generated using a CRC generating equation based on input bits. After the CRC parity bits are attached, bits may be denoted by $O_{r0}, O_{r1}, O_{r2}, \ldots, O_{rKr-1}$ or $C_{r0}, C_{r1}, C_{r2}, \ldots, C_{rKr-1}$ in the same space or different spaces. The CRC parity bits may be attached in a forward or backward direction of a code block according to system requirements.

Third Embodiment

Figure 5:
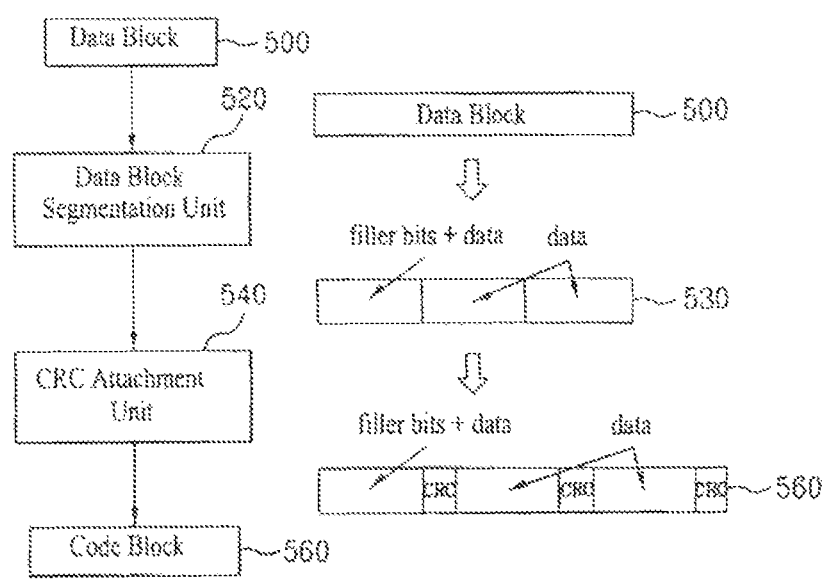

FIG. 5 is a diagram illustrating another example of a process of attaching CRC codes to code blocks according to an exemplary embodiment of the present invention.

In FIG. 5, the size of an input code block 530 input to a CRC attachment unit 540 has a value obtained by subtracting a CRC size L from the size of an output code block 560. Although the operation of a data block segmentation unit 520 for dividing a data block (a first data block 500) is similar to the operation of the data block segmentation units shown in FIG. 3 and FIG. 4, a method of allocating data to a code block (a second data block) and a method of generating a CRC-attached block are different from the methods shown in FIG. 3 and FIG. 4.

Namely, although a CRC size is considered to divide the data block, a CRC area is not ensured in the size of the code blocks input to the CRC attachment unit, which is different from the method shown in FIG. 4.

Referring to FIG. 5, the first data block 500 is input to the data block segmentation unit 520 and segmented into the code block 530 and the code block 530 is input to the CRC attachment unit 540, thereby generating the CRC-attached code block 56.

In FIG. 5, if the data block 500 is input to the data block segmentation unit 520, the data block segmentation unit 520 calculates the number C and the size Z of code blocks in consideration of a CRC size. The data block segmentation unit 520 also calculates a filler bit length F using the number C and the size K of code blocks. The data block segmentation unit 520 allocates filler bits and data to the first block among the code blocks. In this case, data is sequentially allocated corresponding to a length subtracting the filler bit length and the CRC size L from the code block size. The CRC size L may be 24 bits.

The data block segmentation unit sequentially allocates data corresponding to a length subtracting the CRC size from the code block size to the second block. A process of allocating data is repeated by the number of the other code blocks. Through the data allocating process, code blocks input to the CRC attachment unit are configured.

That is, the number C of code blocks calculated by the data block segmentation unit is delivered to the CRC attachment unit so that the CRC attachment unit can use the number C of code blocks to attach CRC codes to the code blocks. Assuming that the size of each code block input to the CRC attachment unit is constant, the size of the input code block 530 is obtained by multiplying the number C of code blocks by the result of subtracting the CRC size K from the code block size K. Alternatively, the size of the input code block 530 may be set to the sum of code block sizes each having a value calculated by subtracting the CRC size L from the code block size K.

When calculating the entire size of the code block 530 input to the CRC attachment unit according to the exemplary embodiment of the present invention described in FIG. 5, the code block 530 has a size less than the size calculated by the method in FIG. 4 by the size of CRC codes which are to be attached to the code blocks.

Referring to FIG. 5, the CRC attachment unit generates a prescribed size of CRC parity bits using a CRC generating equation based on the input code blocks and the number of code blocks. The CRC attachment unit attaches the parity bits to the end of each code block in a forward or backward direction.

Using the method described with reference to FIG. 5, the data block having a prescribed size is comprised of CRC-attached code blocks passing through the data block segmentation unit and the CRC attachment unit.

However, if the data block is comprised of one code block including a CRC code, a step of passing through the CRC attachment unit 540 after allocating data is omitted. Namely, if the data block size is less than or equal to the maximum code block size, it is unnecessary to divide the data block, and the CRC code included originally in the data block is used without repeatedly attaching CRC codes through the CRC attachment unit 540.

A detailed example of configuring a code block input to the CRC attachment unit when a CRC code is not included in the code block although the CRC size is considered to configure the code block will now be described according to another exemplary embodiment of the present invention.

The following Table 4 illustrates a configuration equation of a code block which does not include a CRC code although the CRC size is considered to generate the code block.

TABLE 4

| Syntax | Value | Notes |
|---|---|---|
| for k = 0 to F−1 | | |
| $\quad O_{0k}$ = 0 or 1 | | |
| end for | | |
| k = F | | |
| s = 0 | | |
| for r = 0 to C−1 | | |
| $\quad$ if r < C_ | | |
| $\quad\quad K_r = K_-$ | | |
| $\quad$ Else | | |
| $\quad\quad K_r = K_+$ | | |
| $\quad$ end if | | |
| $\quad$ while (k < $K_r$−L) | | |
| $\quad\quad O_{rk} = b_s$ | | |
| $\quad\quad$ k = k+1 | | |
| $\quad\quad$ s = s+1 | | |
| $\quad$ end while | | |
| $\quad$ k = 0 | | |
| end for | | |

The following Table 5 illustrates a configuration equation of a code block which takes into consideration a CRC size but does not include a CRC code when the data block is comprised of one code block including the CRC code.

TABLE 5

| Syntax | Value | Notes |
|---|---|---|
| if C = 1 | | |
|     L = 0 | | |
| end if | | |
| for k = 0 to F−1 | | |
|     $O_{0k}$ = 0 or 1 | | |
| end for | | |
| k = F | | |
| s = 0 | | |
| for r = 0 to C−1 | | |
|     if r < $C_-$ | | |
|         $K_r = K_-$ | | |
|     Else | | |
|         $K_r = K_+$ | | |
|     end if | | |
|     while(k < $K_r$−L) | | |
|         $O_{rk} = b_s$ | | |
|         k = k+1 | | |
|         s = s+1 | | |
|     end while | | |
|     k = 0 | | |
| end for | | |

Principal parameters used in Table 4 and Table 5 are as follows. 'F' indicates the length of filler bits, '$O_{rk}$' indicates an output of the data block segmentation unit, 'r' indicates a code block number, and 'k' indicates a bit number of the rth block.

It is assumed that the code blocks have sizes $K_+$ and $K_-$ (where $K_-$ is less than $K_+$). Parameters '$C_+$' and '$C_-$' indicate the numbers of specific code blocks, that is, the numbers of code blocks having the sizes $K_+$ and $K_-$, respectively. A parameter 'L' shown in Table 4 and Table 5 indicates a CRC size to be attached to each code block and '$K_r$' indicates a size to be applied to a code block.

Referring to FIG. 5, the code block which considers the CRC size but does not include the CRC code is configured and Equation 27 may be used to attach the CRC code to the code blocks.

If the data block is not segmented and is comprised of one code block including the CRC code, the code block which takes into consideration the CRC size but does not include the CRC code is configured and Equation 28 may be used to attach CRC code to the code block.

Bits after the CRC attachment may be denoted by $O_{r0}$, $O_{r1}$, $O_{r2}$, ..., $O_{rKr-1}$ or $C_{r0}$, $C_{r1}$, $C_{r2}$, ..., $C_{rKr-1}$. Namely, the bits may be comprised in the same space or different spaces.

Fourth Embodiment

Figure 6:
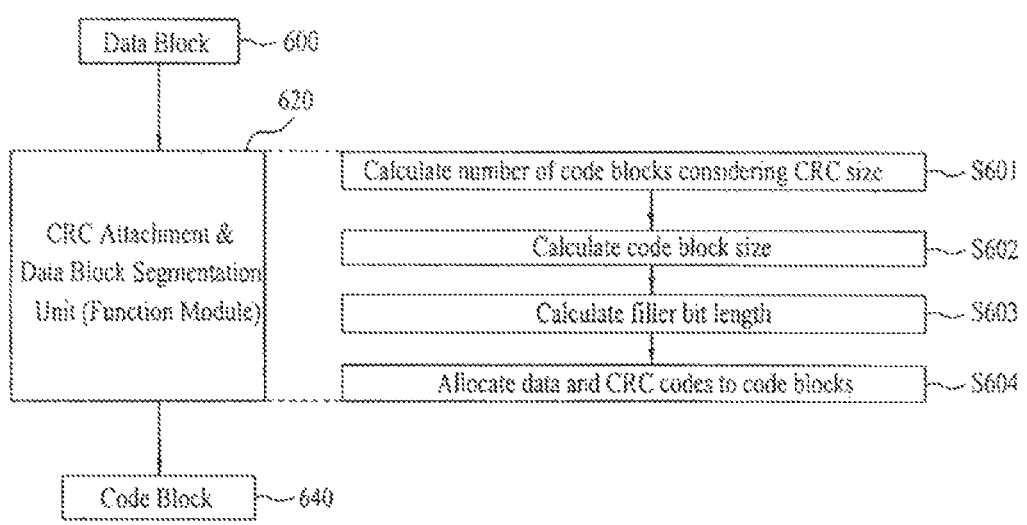

FIG. 6 is a diagram illustrating a process of segmenting a data block and attaching CRC codes in consideration of a CRC size according to an exemplary embodiment of the present invention.

A data block (a first data block 600) having a prescribed size is input to a function module (a data block segmentation and CRC attachment unit) 620 to generate a code block (a second data block 640). The function module 620 segments the data block and simultaneously attaches CRC codes. The data block 600 may include a CRC code therein before being input to the function module 620.

If the data block 600 is input to the function module 620, the function module 620 calculates the number C of code blocks considering a CRC size L (step S601). The function module 620 calculates a code block size K using the number C of code blocks (step S602). The function module 620 calculates a filler bit length F using the number C of code blocks and the code block size K (step S603).

The methods of calculating the number C of code blocks, the code block size K, and the filler bit length F used in steps S601 to S603 may use one or more methods used in FIG. 3 to FIG. 5. However, a method of allocating data and CRC codes to code blocks in step S604 is different from the methods described with reference to FIG. 3 to FIG. 5. The CRC size L may be 24 bits.

Referring to FIG. 6, step S604 for allocating data and CRC codes to code blocks is as follows.

While filler bits are attached to the beginning of the first code block and data corresponding to a length except for the CRC size L is allocated in the first code block, a CRC code is attached to the end of the first code block in a forward or backward direction. In the second code block, data corresponding to a length except for the CRC size is allocated and the CRC code is attached the end of the second code block in a forward or backward direction. The above process for allocating data in the code blocks following the second code block is repeated for each of the number C of the remaining code blocks. The code block size K may have the same size or specific values (for example, $K_+$ or $K_-$). Values $K_+$ and $K_-$ indicate a minute variation amount of K. Using the method shown in FIG. 6, the data block having a prescribed size may be comprised of a CRC-attached code block 640 through the function module 620. However, if the data block is comprised of one code block including a CRC code, the CRC code is not attached after data is allocated, because the data block includes the CRC code.

After the code block is generated, channel coding is performed. Channel coding refers to a process of converting an original code generated by a transmitting side so that a receiving side can detect and/or correct errors during transmission of data through a channel. That is, channel coding refers to a process for overcoming an error in channel environments having limited power or limited bandwidths.

Various methods may be applied for channel coding. Channel coding includes linear coding and cyclic coding of a non-memory type and tail biting convolution coding and turbo coding of a memory type.

Figure 7:
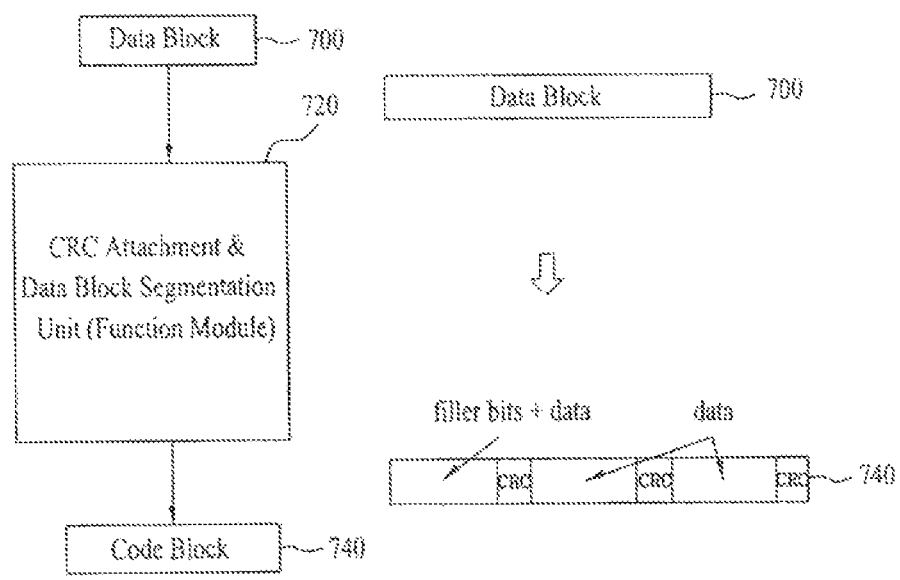

FIG. 7 is a diagram illustrating a process of converting a data block into code blocks in consideration of a CRC size according to an exemplary embodiment of the present invention.

Referring to FIG. 7, if a data block (a first data block 700) is input to a function module (CRC attachment and data block segmentation) 720, the data block is segmented into a code block (a second data block 740) in consideration of a CRC size L. A process of converting the data block into the code block through the CRC attachment unit and data block segmentation may use the process shown in FIG. 6. In FIG. 7, the data block 700 may include a CRC code for the data block before the data block is input to the function module.

An example of performing data block segmentation and CRC attachment in one function module will now be described.

The following Table 6 shows a configuration equation of the data block for segmenting the data block and attaching the CRC code when data block segmentation and CRC code attachment are performed in one function module 720.

TABLE 6

| Syntax | Value | Notes |
|---|---|---|
| for k = 0 to F−1 | | |
|     $O_{0k}$ = 0 or 1 | | |
| end for | | |

TABLE 6-continued

| Syntax | Value | Notes |
|---|---|---|
| k = F | | |
| s = 0 | | |
| for r=0 to C-1 | | |
|   if r < C_ | | |
|     K_r = K_ | | |
|   else | | |
|     K_r = K_+ | | |
|   end if | | |
|   while (k < K_r) | | |
|     if(k < K_r - L) | | |
|       O_rk = b_s | | Allocate b_s to O_rk and simultaneously generate parity bits |
|       s = s+1 | | |
|     else | | |
|       O_rk = p_{(L-1-(k-(Kr-L)))} | | |
|     end if | | |
|     k = k+1 | | |
|   end while | | |
|   k = 0 | | |
| end for | | |

The following Table 7 shows a configuration equation of the data block for segmenting the data block and attaching the CRC codes, when the data block is not segmented and is comprised of one code block including a CRC code (i.e., C=1) and when data block segmentation and CRC code attachment are performed in one function module 720.

TABLE 7

| Syntax | Value | Notes |
|---|---|---|
| if C=1 | | |
|   L=0 | | |
| end if | | |
| for k = 0 to F-1 | | |
|   O_0k = 0 or 1 | | |
| end for | | |
| k = F | | |
| s = 0 | | |
| for r=0 to C-1 | | |
|   if r < C_ | | |
|     K_r = K_ | | |
|   else | | |
|     K_r = K_+ | | |
|   end if | | |
|   while (k < K_r) | | |
|     if(k < K_r - L) | | |
|       if C = 1 | | |
|         O_rk = b_s | | Allocate b_s to O_rk and simultaneously generate parity bits |
|       else | | |
|         O_rk = b_s | | |
|       end if | | |
|       s = s+1 | | |
|     else | | |
|       O_rk = pr(Kr-k-1) | | |
|     end if | | |
|     k = k+1 | | |
|   end while | | |
|   k = 0 | | |
| end for | | |

Principal parameters used in Table 6 and Table 7 are as follows. A parameter 'F' indicates the length of filler bits, '$O_{rk}$' indicates an output of a data block segmentation unit, 'r' indicates a code block number, and 'k' indicates a bit number of the rth block.

It is assumed that the code blocks have sizes $K_+$ and $K_-$ (where $K_-$ is less than $K_+$). Parameters '$C_+$' and '$C_-$' indicate the numbers of specific code blocks, that is, the numbers of code blocks having the sizes $K_+$ and $K_-$, respectively. A parameter 'L' shown in Table 6 and Table 7 indicates a CRC size to be attached per code block and 'Kr' indicates a size to be applied to a final code block.

CRC parity bits for CRC code attachment may be denoted by $p_{r0}, p_{r1}, p_{r2}, \ldots, p_{rL-1}$. The CRC parity bits may be generated using a CRC generating equation based on input blocks. Bits after data segmentation and CRC attachment may be denoted by $O_{r0}, O_{r1}, O_{r2}, \ldots, O_{rKr-1}$ or $C_{r0}, C_{r1}, C_{r2}, \ldots, C_{rKr-1}$. Namely, the bits may be included in the same space or different spaces.

Fifth Embodiment

A further exemplary embodiment of the present invention may be constructed by a combination of the methods described in the first to fourth embodiments.

Data of a large size may be segmented, before transmission, into data of proper sizes according to system requirements to effectively transfer data. Accordingly, it is necessary to segment an input data block by an appropriate method. It may be important to determine which method is to be used for data block segmentation.

The data block segmentation and CRC attachment unit according to the further exemplary embodiment of the present invention is one function module for segmenting a logical data block (or input bit) and attaching CRC codes. The function module may segment the input data block into code blocks of a proper number in consideration of the size of error detection codes (for example, CRC codes) included in the code blocks to be segmented.

If the input bits are segmented into code blocks (or segments), a maximum code block size Z may be determined according to system requirements. In the exemplary embodiments of the present invention, the maximum code block size is desirably 6144 bits.

A sequence of the input bits (or data block) input to the function module may be denoted by b0, b1, b2, ..., bB-1. The size of the input bits may be indicated by 'B' (where B is above 1). If the input bit size B is larger than the maximum code block size Z, segmentation of the input bits may be performed. The CRC size L may be 24 bits. Namely, a 24-bit CRC code, which is one type of an error detection code, may be attached to each code block generated by segmentation of the input bits.

If the length of filler bits is not 0, the filler bits may be added to the beginning of the first code block. If the input bit size B is less than 40 bits, the filler bits are added to the beginning of the code block. The filler bits are set to null at the input to the function module.

The total number C of code blocks generated by segmentation of the input bits may be calculated by the following Equation 29.

[Equation 29]

$$\begin{aligned}&\text{if } B \leq Z \\ &\quad L = 0 \\ &\quad C = 1 \\ &\quad B' = B \\ &\text{else} \\ &\quad L = 24 \\ &\quad C = \lceil B / (Z - L) \rceil \\ &\quad B' = B + C*L \\ &\text{end if}\end{aligned}$$

In Equation 29, B indicates the size of input bit sequence (or data block) and B' indicates a value obtained by adding the input bit sequence size B to the result of multiplying the number C of code blocks by the CRC size L. That is, B' indicates a modified input bit sequence size for calculating the number and size of code blocks.

In Equation 29, if the input bit size B is less than the maximum code block size Z, the size of error detection codes to be attached to the code blocks may be set to 0 and the total number C of code blocks may be set to 1. The modified input bit sequence size B' may be set to be equal to the input bit sequence size B.

If the input bit size B is larger than the maximum code block size Z, the CRC size L may be set to 24 bits and the total number C of code blocks may be set to a value obtained by rounding up a value obtained by dividing the input bit sequence size B by the result of subtracting the CRC size from the maximum code block size Z. The modified input bit sequence size B' may be set to a value obtained by adding the input bit size B to the result of multiplying the total number C of code blocks by the CRC size L.

If the number of code blocks is not 0, the code blocks generated from the function block may be denoted by $c_{r0}, c_{r1}, c_{r2}, c_{r3}, \ldots, c_{r(Kr-1)}$ (where r indicates a code block number and Kr indicates the size of the rth code block.

The function module should calculate the size of each code block after calculating the number of code blocks through Equation 29. The input bits may be segmented into code blocks having the same size or having a specific size (for example, $K_+$ or $K_-$). It is apparent that the code blocks have various sizes according to system or user requirements.

In another exemplary embodiment of the present invention, the sizes of code blocks may be $K_+$ and $K_-$. In this case, the number C of code blocks should not be 0.

In an exemplary embodiment of the present invention, the size of first code blocks (or first segments) may be indicated by $K_+$. The size $K_+$ may be determined from the values K in Table 1. The size $K_+$ may be determined by a minimum value among the values K satisfying the condition that a value obtained by multiplying the number C of code blocks by the code block size K is above the modified input bit sequence size B'.

If the number C of code blocks is 1, the number $C_+$ of code blocks having the size $K_+$ is 1 and the number $C_-$ of code blocks having the size $K_-$ is 0.

If the number of code blocks is 2 or more (C>1), the size $K_-$ of second code blocks (or second segments) may be determined by the values K shown in Table 1. Desirably, the size $K_-$ has a maximum value among values K less than the size $K_+$. A variation amount $\Delta K$ of K indicates a difference between $K_+$ and $K_-$.

The number $C_-$ of second code blocks having the size $K_-$ may be calculated by rounding down a value obtained by dividing a value, which is obtained by subtracting the modified input bit sequence size B' from the result of multiplying the number C of code blocks by the first code block size $K_+$, by the variation amount $\Delta K$ of K.

The number C+ of first code blocks having the size K+ may be calculated by subtracting the number C− of second code blocks from the total number C of code blocks.

Since the CRC size L included in the code block is considered to calculate the number C of code blocks and the code block size K, the sum of the code blocks may be larger than the modified input bit sequence size B'. Then filler bits corresponding to the difference may be added to the first code block.

In another exemplary embodiment of the present invention, a filler bit length F may be calculated by a difference between the modified input bit sequence size B' and a value of $(C_+ \times K_+)+(C_- \times K_-)$.

Table 8 illustrates a configuration equation generated considering the CRC size.

TABLE 8

| Syntax | Value | Notes |
|---|---|---|
| for k = 0 to F−1 | | |
|   $C_{0k}$ = <NULL> | | |
| end for | | |
| k = F | | |
| s = 0 | | |
| for r = 0 to C−1 | | |
|   if r < $C_-$ | | |
|     $K_r = K_-$ | | |
|   else | | |
|     $K_r = K_+$ | | |
|   End if | | |
|   while (k < $K_r$−L) | | |
|     $c_{rk} = b_s$ | | |
|     k = k + 1 | | |
|     s = s + 1 | | |
|   End while | | |
|   if C > 1 | | |
|     while k < Kr | | |
|       $c_{rk} = p_{r(Kr-k-1)}$ | | The sequence $c_{r0}, c_{r1}, c_{r2}, \ldots, c_{r(Kr-L-1)}$ is used to calculate the CRC parity bits $p_{r0}, p_{r1}, p_{r2}, \ldots, p_{r(L-1)}$ according to subclause 5.1.1 |
|       k = k + 1 | | |
|     end while | | |
|   End if | | |
|   k = 0 | | |
| end for | | |

Refer to Table 8, the function module configures a code block by including the CRC size code block. A code block sequence $c_{r0}, c_{r1}, c_{r2}, \ldots, c_{r(Kr-1)}$ may be used to calculate CRC parity bits $p_{r0}, p_{r1}, p_{r2}, \ldots, p_{r(L-1)}$.

In another exemplary embodiment of the present invention, an error detection code included previously in the input data block may be referred to as a transport block (TB) CRC (or first error detection code) and an error detection code included in code blocks to be segmented may be referred to as a code block (CB) CRC (or second error detection code). An initial data block before a TB CRC is attached to input bits may be referred to as initial input bits or a transport block. The size of a TB CRC may be 24 bits.

If segmentation of the data block in the fifth embodiment is not performed (i.e., C=1), the initially input data block may be configured by a final code block including a TB CRC. However, the final code block may be configured by attaching a CB CRC instead of the TB CRC according to user requirements and embodiments of the present invention.

Sixth Embodiment

Another exemplary embodiment of the present invention may be constructed by a combination of the methods described in the first to fourth embodiments.

A data block segmentation and CRC attachment unit according to the another exemplary embodiment of the present invention is one function module to segment an input data block into code blocks of proper sizes in consideration of error detection codes (for example, CRC codes) included in the code blocks to be segmented. If an input bit sequence is segmented into code blocks, a size which can be maximally segmented is determined according to system requirements. In the exemplary embodiments of the present invention, a maximum code block size Z may be 6144 bits.

A sequence of input bits (or data block) input to the function module may be denoted by $b_0, b_1, b_2, \ldots, b_{B-1}$. It is assumed that an input bit size is above 1. If the input bit size B is larger than the maximum code block size Z, segmentation of the input bits is performed. A CRC size to be attached to code blocks is considered to segment the input bits.

If the length of filler bits is not 0, the filler bits may be added to the beginning of the first code block. The filler bits are set to null at the input to the function module.

The total number C of code blocks generated by segmentation of the input bits may be calculated by the following Equation 30.

[Equation 30]

If B ≤ Z
   C = 1
   B' = B
Else
   C = ⌈B / (Z − L)⌉
   B' = B + C × L
End

In Equation 30, B indicates the size of input bits (or data block) and B' indicates a value obtained by adding the input bit size B to the result of multiplying the number C of code blocks by the CRC size L. That is, B' indicates a modified input bit sequence size for acquiring the code block size K.

If the number of code blocks is not 0, the code blocks generated from the function block may be denoted by $c_{r0}, c_{r1}, c_{r2}, c_{r3}, \ldots, c_{rKr-1}$ (where r indicates a code block number and Kr indicates the size of the rth code block).

The function module should calculate the size of each code block after calculating the number of code blocks through Equation 30. Each of the code blocks may have size $K_+$ or $K_-$. In this case, the number of code blocks should not be 0.

In the exemplary embodiment of the present invention, the size of a first code block may be indicated by $K_+$. The size $K_+$ may be determined from the values K in Table 1. The size $K_+$ may have a minimum value among the values K satisfying the condition that a value obtained by dividing the modified input bit sequence size B' by the number C of code blocks be larger than or equal to the values K.

If the number C of code blocks is 1, the number $C_+$ of first code blocks having the size $K_+$ is 1 and the number '$C_-$' of second code blocks having the size $K_-$ is 0.

If the number of code blocks is 2 or more (C>1), the size $K_-$ of second code blocks may be set to a maximum value among the values K, shown in Table 1, which is less than $K_+$. A variation amount ΔK of K indicates a difference between $K_+$ and $K_-$.

The number $C_-$ of second code blocks having the size $K_-$ may be calculated by rounding down a value obtained by dividing a value, which is obtained by subtracting the modified input bit sequence size B' from the result of dividing the number C of code blocks by the first code block size $K_+$, by the variation amount ΔK of K. The number $C_+$ of first code blocks having the size K+ may be calculated by subtracting the number $C_-$ of second code blocks from the total number C of code blocks. The size L of CRC parity bits may be set to 24 bits.

Since the CRC size L is considered to calculate the number and size of code blocks, the code block size may be larger than the modified input bit sequence size B'. In this case, filler bits corresponding to the difference may be added to the first code block.

In another exemplary embodiment of the present invention, a filler bit length F may be calculated by a difference between the modified input bit sequence size B' and a value of $(C_+ \times K_+) + (C_- \times K_-)$.

Table 9 illustrates a configuration equation of a code block generated considering the CRC size.

TABLE 9

| Syntax | Value | Notes |
|---|---|---|
| for k = 0 to F−1 | | |
|   $c_{0k}$ = <NULL> | | |
| end for | | |
| k = F | | |
| s = 0 | | |
| for r = 0 to C−1 | | |
|   if r < $C_-$ | | |
|     $K_r$ = $K_-$ | | |
|   else | | |
|     $K_r$ = $K_+$ | | |
|   end if | | |
|   while (k < $K_r$−L) | | |
|     $c_{rk}$ = $b_s$ | | |
|     k = k + 1 | | |
|     s = s + 1 | | |
|   end while | | |
|   if C > 1 | | |
|     while k < Kr | | The sequence $c_{r0}, c_{r1}, c_{r2}, \ldots, c_{r(Kr-L-1)}$ is used to calculate the CRC parity bits $p_{r0}, p_{r1}, p_{r2}, \ldots, p_{r(L-1)}$ according to table 1 |
|       $c_{rk}$ = $p_{r(Kr-k-1)}$ | | |
|       k = k + 1 | | |
|     end while | | |
|   end if | | |
|   k = 0 | | |
| end for | | |

In Table 9, the function module configures a code block by including the CRC size. A code block sequence $c_{r0}, c_{r1}, c_{r2}, \ldots, c_{r(Kr-1)}$ may be used to calculate CRC parity bits $p_{r0}, p_{r1}, p_{r2}, \ldots, p_{r(L-1)}$.

Seventh Embodiment

Another exemplary embodiment of the present invention may be constructed by a combination of the methods described in the first to fourth embodiments.

Another exemplary embodiment of the present invention defines a function module for CRC attachment and input bit segmentation. The function module may segment the input data block into code blocks of a proper number in consideration of the size of error detection codes (for example, CRC codes) included in the code blocks to be segmented. If an input bit sequence is segmented into code blocks, a size Z which can be maximally segmented is determined according to system requirements. In the exemplary embodiments of the present invention, the maximum code block size may be 6144 bits.

Code blocks generated by segmentation of input bits input to the function module may be denoted by b0, b1, b2, . . . , bB−1. The segmentation of the input bits can be performed when the input bit size B is larger than the maximum code block size.

If the input bit size B is not 0 and the length of filler bits is not 0, the filler bits may be added to the beginning of the first code block. If the input bit size B is less than 40 bits, the filler bits are added to the beginning of the code block. The filler bits are set to null.

The number of code blocks generated by segmentation of the input bits may be calculated by the following Equation 31.

[Equation 31]

$$\begin{aligned}
&\text{If } B \leq Z \\
&\quad B' = B \\
&\text{Else} \\
&\quad \text{If } (\lceil B/Z \rceil \times L + B > \lceil B/Z \rceil \times Z) \\
&\quad\quad B' = B + (\lceil B/Z \rceil + 1) \times L \\
&\quad \text{Else} \\
&\quad\quad B' = B + \lceil B/Z \rceil \times L \\
&\quad \text{End} \\
&\text{End} \\
&C = \lceil B'/Z \rceil
\end{aligned}$$

In Equation 31, if the input bit size B is less than or equal to the maximum code block size Z, the input bit size B equals the modified input bit sequence size B'. When the input bit size B is larger than the maximum code block size Z, the following method is used.

If a value, obtained by adding B to the result of multiplying L by a value obtained by rounding up the result of dividing B by Z, is larger than a value, obtained by multiplying z by a value obtained by rounding up the result of dividing B by Z, the modified input bit sequence size B' assumes a value obtained by rounding up the result of dividing B by Z, plus 1 times the CRC size L plus the data block size B.

Through the above process, the number C of code blocks is determined by a value obtained by rounding up the result of dividing the modified input bit sequence size B' by the maximum code block size Z. Input bits segmented from the function block may be denoted by $c_{r0}, c_{r1}, c_{r2}, c_{r3}, \ldots, c_{rKr-1}$ (where r indicates a code block number and Kr indicates a size of the rth code block).

The function module should calculate the size of each code block after calculating the number of code blocks through Equation 31. Each of the code blocks may have size $K_+$ or $K_-$. In this case, the number of code blocks should not be 0.

In the exemplary embodiment of the present invention, the size of a first code block may be indicated by $K_+$. The size $K_+$ may be determined from the values K in Table 1. The size $K_+$ may have a minimum value among the values K satisfying the condition that a value obtained by dividing the modified input bit sequence size B' by the number C of code blocks is larger than or equal to the values K.

If the number C of code blocks is 1, the number $C_+$ of first code blocks having the size $K_+$ is 1 and the number $C_-$ of second code blocks having the size $K_-$ is 0.

If the number of code blocks is 2 or more (C>1), the size $K_-$ of second code blocks may be determined by a maximum value among the values K, shown in Table 1, which is less than $K_+$. A variation amount $\Delta K$ of K indicates a difference between $K_+$ and $K_-$.

The number $C_-$ of second code blocks having the size $K_-$ may be calculated by rounding down a value obtained by dividing a value, which is obtained by subtracting the modified input bit sequence size B' from the result of dividing the number C of code blocks by the first code block size $K_+$, by the variation amount $\Delta K$ of K. The number $C_+$ of first code blocks having the size $K_+$ may be calculated by subtracting the number $C_-$ of second code blocks from the total number C of code blocks. The size L of CRC parity bits may be set to 24 bits.

Since the CRC size L is considered to calculate the number and size of code blocks, the code block size may be larger than the modified input bit sequence size B'. Then filler bits corresponding to the difference may be added to the first code block.

In another exemplary embodiment of the present invention, a filler bit length F may be calculated by a difference between the modified input bit sequence size B' and a value of $(C_+ \times K_+)+(C_- \times K_-)$.

Table 10 illustrates a configuration equation of a code block generated considering the CRC size.

TABLE 10

| Syntax | Value | Notes |
|---|---|---|
| for k = 0 to F−1 | | |
| $\quad c_{0k}$ = <NULL> | | |
| end for | | |
| k = F | | |
| s = 0 | | |
| for r = 0 to C−1 | | |
| $\quad$ if r < $C_-$ | | |
| $\quad\quad K_r = K_-$ | | |
| $\quad$ else | | |
| $\quad\quad K_r = K_+$ | | |
| $\quad$ end if | | |
| $\quad$ if(C > 1) | | |
| $\quad\quad K_r = K_r - L$ | | |
| $\quad$ end | | |
| $\quad$ while k < $K_r$ | | |
| $\quad\quad c_{rk} = b_s$ | | |
| $\quad\quad$ k = k + 1 | | |
| $\quad\quad$ s = s + 1 | | |
| $\quad$ end while | | |
| $\quad$ k = 0 | | |
| end for | | |

It can be understood through Table 10 that the function module configures code blocks by segmentation of input bits in consideration of a CRC size.

Eighth Embodiment

Another exemplary embodiment of the present invention may be constructed by a combination of the methods described in the first to fourth embodiments.

Data of a large size may be segmented, before transmission, into data of proper sizes according to system requirements to effectively transfer data. Accordingly, it is necessary to segment an input data block by an appropriate method. It may be important to determine which method is to be used for data block segmentation.

A data block segmentation and CRC attachment unit according to another exemplary embodiment of the present invention constructs one function module. The function module segments the input data block into code blocks of a proper number in consideration of the size of error detection codes (for example, CRC codes) included in the code blocks to be segmented. If an input bit sequence is segmented into code blocks, a size which can be maximally segmented is determined according to system requirements. In the exemplary embodiments of the present invention, the maximum code block size may be 6144 bits.

An input bit (or data block) sequence input to the function module may be denoted by $b_0, b_1, b_2, \ldots, b_{B-1}$. The size of the input bits may be indicated by 'B' (where B is above 1). If the input bit size B is larger than the maximum code block size Z, the input bits may be segmented in consideration of a CRC size. The CRC size may be 24 bits. Namely, a 24-bit CRC code, which is one type of an error detection code, may be attached to each code block generated by segmentation of the input bit sequence.

If the length of filler bits is not 0, the filler bits may be added to the beginning of the first code block. If the input bit size B is less than 40 bits, the filler bits are added to the beginning of the code block. The filler bits are set to null.

The number C of code blocks generated by segmentation of the input bits may be calculated by the following Equation 32.

$$C = \lceil B/Z - L \rceil$$

$$B' = B + C*L \qquad \text{[Equation 32]}$$

In Equation 32, 'B' indicates the size of input bits (or data block) and a modified input bit sequence size B' is obtained by adding the input bit size B to the result of multiplying the number C of code blocks by the CRC size L.

Namely, the modified input bit sequence size B' is a temporal value to calculate the number and size of code blocks.

If the number of code blocks is not 0, the code blocks generated from the function block may be denoted by $c_{r0}$, $c_{r1}$, $c_{r2}$, $c_{r3}$, ..., $c_{rKr-1}$ (where r indicates a code block number and Kr indicates the size of the rth code block).

The function module should calculate the size of each code block after calculating the number of code blocks through Equation 32. Each of the code blocks may have size $K_+$ or $K_-$. In this case, the number of code blocks should be above 1.

In the exemplary embodiment of the present invention, the size of a first code block may be indicated by $K_+$. The size $K_+$ may be determined from the values K in Table 1. The size $K_+$ may have a minimum value among the values K satisfying the condition that a value obtained by dividing the modified input bit sequence size B' by the number C of code blocks is larger than or equal to the values K. If the number C of code blocks is 1, the number $C_+$ of first code blocks having the size $K_+$ is 1 and the number $C_-$ of second code blocks having the size $K_-$ is 0.

If the number of code blocks is 2 or more (C>1), the size $K_-$ of second code blocks may be determined by a maximum value among the values K, shown in Table 1, which is less than $K_+$. A variation amount $\Delta K$ of K indicates a difference between $K_+$ and $K_-$.

The number $C_-$ of second code blocks having the size $K_-$ may be calculated by rounding down a value obtained by dividing a value, which is obtained by subtracting the modified input bit sequence size B' from the result of dividing the number C of code blocks by the first code block size $K_+$, by the variation amount $\Delta K$ of K. The number $C_+$ of first code blocks having the size $K_+$ may be calculated by subtracting the number $C_-$ of second code blocks from the total number C of code blocks.

Since the CRC size L is considered to calculate the number and size of code blocks, the code block size may be larger than the modified input bit sequence size B'. Then filler bits corresponding to the difference may be added to the first code block.

In another exemplary embodiment of the present invention, a filler bit length F may be calculated by a difference between the modified input bit sequence size B' and a value of ($C_+ \times K_+$)+($C_- \times K_-$).

Table 11 illustrates a configuration equation of a code block generated considering the CRC size.

TABLE 11

| Syntax | Value | Notes |
|---|---|---|
| for k = 0 to F−1 | | |
|    $c_{0k}$ = <NULL> | | |
| end for | | |
| k = F | | |
| s = 0 | | |
| for r = 0 to C−1 | | |
|   if r < $C_-$ | | |
|     $K_r$ = $K_-$ | | |

TABLE 11-continued

| Syntax | Value | Notes |
|---|---|---|
|   else | | |
|     $K_r$ = $K_+$ | | |
|   end if | | |
|   while (k < $K_r$−L) | | |
|     $c_{rk}$ = $b_s$ | | |
|     k = k + 1 | | |
|     s = s + 1 | | |
|   end while | | |
|   if C > 1 | | |
|     while k < Kr | | |
|       $c_{rk}$ = $p_{r(Kr-k-1)}$ | | The sequence $c_{r0}$, $c_{r1}$, $c_{r2}$, ..., $c_{r(Kr-L-1)}$ is used to calculate the CRC parity bits $p_{r0}$, $p_{r1}$, $p_{r2}$, ..., $p_{r(L-1)}$ according to table 1 |
|       k = k + 1 | | |
|     end while | | |
|   end if | | |
|   k = 0 | | |
| end for | | |

It can be understood through Table 11 that the function module configures code blocks in consideration of a CRC size. In Table 11 a code block sequence $c_{r0}$, $c_{r1}$, $c_{r2}$, ..., $c_{r(Kr-1)}$ may be used to calculate CRC parity bits $p_{r0}$, $p_{r1}$, $p_{r2}$, ..., $p_{r(L-1)}$.

Ninth Embodiment

Another exemplary embodiment of the present invention may be constructed by a combination of the methods described in the first to fourth embodiments.

A method according to the ninth embodiment is similar to the method described in the eighth embodiment. That is, the method of calculating the number of code blocks generated by segmentation of input bits may use the method described in the eighth embodiment. Further, methods for calculating filler bits, the size of code blocks, the number of code blocks are similar to the methods described in the eighth embodiment. Hereinafter, only different parts in the method of configuring the segmented code blocks will be described.

The following Table 12 illustrates a configuration equation of a code block generated considering a CRC size.

TABLE 12

| Syntax | Value | Notes |
|---|---|---|
| for k = 0 to F−1 | | |
|   $c_{0k}$ = <NULL> | | |
| end for | | |
| k = F | | |
| s = 0 | | |
| for r = 0 to C−1 | | |
|   if r < $C_-$ | | |
|     $K_r$ = $K_-$ | | |
|   else | | |
|     $K_r$ = $K_+$ | | |
|   end if | | |
|   while k < $K_r$ | | |
|     if (k < $K_r$ − L) | | |
|       $c_{rk}$ = $b_s$ | | |
|       s = s + 1 | | |
|     else | | |
|       $c_{rk}$ = $p_{r(Kr-k-1)}$ | | The sequence $c_{r0}$, $c_{r1}$, $c_{r2}$, ..., $c_{r(Kr-L-1)}$ is used to calculate the CRC parity bits $p_{r0}$, $p_{r1}$, $p_{r2}$, ..., $p_{r(L-1)}$ according to table 1 |
|     end if | | |
|     k = k + 1 | | |
|   end while | | |
|   k = 0 | | |
| end for | | |

It can be understood through Table 12 that the function module configures code blocks in consideration of a CRC size. In Table 12 a code block sequence $c_{r0}, c_{r1}, c_{r2}, \ldots, c_{r(Kr-1)}$ may be used to calculate CRC parity bits $p_{r0}, p_{r1}, p_{r2}, \ldots, p_{r(L-1)}$.

Tenth Embodiment

Another exemplary embodiment of the present invention may be configured by a combination of the methods described in the first to fourth exemplary embodiments.

The tenth embodiment is similar to the fifth embodiment. Methods for calculating the number of code blocks, the size of code blocks, and the length of filler bits are the same as the methods described in the fifth embodiment. However, a method for allocating data to each code block and simultaneously attaching error detection codes is different from the method described in the fifth embodiment.

The following Table 13 illustrates a configuration equation of a code block generated considering a CRC size.

TABLE 13

| Syntax | Value | Notes |
|---|---|---|
| for k = 0 to F−1 | | |
|     $c_{0k}$ = <NULL> | | |
| end for | | |
| k = F | | |
| s = 0 | | |
| for r = 0 to C−1 | | |
|   if r < C_ | | |
|     $K_r = K_-$ | | |
|   else | | |
|     $K_r = K_+$ | | |
|   End if | | |
|   while (k < $K_r$−L) | | |
|     $c_{rk} = b_s$ | | |
|     k = k + 1 | | |
|     s = s + 1 | | |
|   End while | | |
|   if C > 1 | | |
|     while k < Kr | | The sequence $c_{r0}, c_{r1}, c_{r2}, \ldots, c_{r(Kr-L-1)}$ is used to calculate the CRC parity bits $p_{r0}, p_{r1}, p_{r2}, \ldots, p_{r(L-1)}$ according to subclause 5.1.1 with the generator polynomial gCRCB(D). For CRC calculation it is assumed that filler bits, if present, have the value 0. |
|       $c_{rk} = p_{r(k+L-Kr)}$ | | |
|       k = k + 1 | | |
|     end while | | |
|   End if | | |
|   k = 0 | | |
| end for | | |

A fundamental description in conjunction with Table 13 is similar to the description with Table 8. Therefore, repetitive parts may refer to the description in Table 8.

In Table 13, if the number C of code blocks is above 1, CRC parity bits are attached to each code block. A code block sequence $c_{r0}, c_{r1}, c_{r2}, \ldots, c_{r(Kr-1)}$ may be used to calculate a CRC parity bit $p_{r0}, p_{r1}, p_{r2}, \ldots, p_{r(L-1)}$. The CRC parity bits may be attached to places of the CRC parity bits included in code blocks in a forward or backward direction. It is assumed in the exemplary embodiment of the present invention that the CRC parity bits are attached in the forward direction.

Equation 33 illustrates attachment of CRC parity bits in a forward direction.

[Equation 33]

$$\begin{aligned}
&\text{If } C > 1 \\
&\quad \text{while } k < Kr \\
&\quad\quad c_{rk} = p_{r(k+L-Kr)} \\
&\quad\quad k = k + 1 \\
&\quad \text{end while} \\
&\text{end if}
\end{aligned}$$

In Equation 33, CRC parity bits ($p_{r(k+L-Kr)}$) input to code blocks are attached in a forward direction. Namely, a CRC code is input after data is input to one code block and a CRC code is input after data is input to another code block. Through those processes, the data and CRC code are simultaneously allocated to the code blocks.

Figure 8:
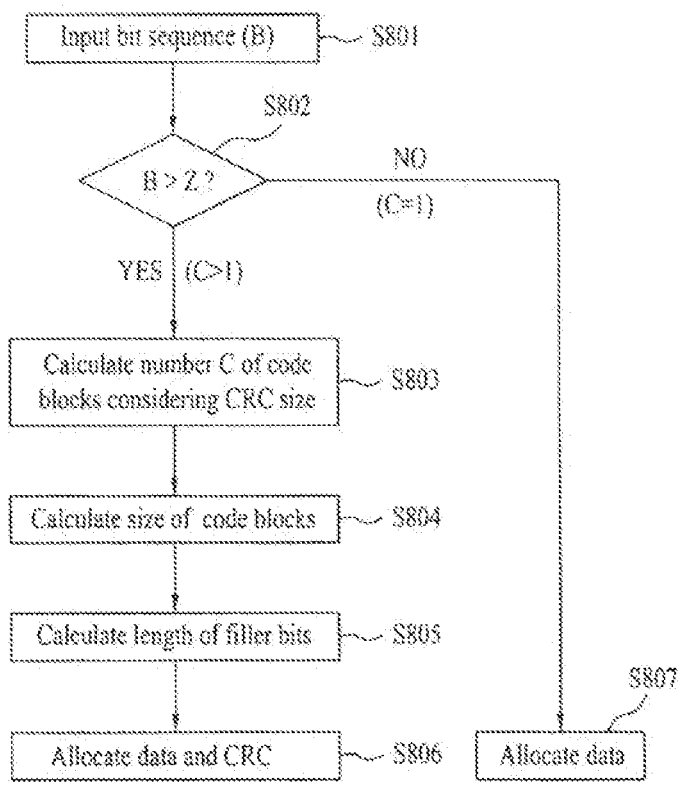

FIG. 8 is a flow chart illustrating a process of segmenting a data block in consideration of a CRC size according to an exemplary embodiment of the present invention.

Data of a large size may be segmented, before transmission, into data of proper sizes according to system requirements to effectively transfer data. Accordingly, it is necessary to segment an input data block by an appropriate method. It may be important to determine which method is to be used for data block segmentation.

A logical data block segmentation and CRC attachment unit according to the exemplary embodiment of the present invention is comprised of one function module to segment an input data block in consideration of the size of error detection codes (for example, CRC codes) included in code blocks to be segmented. However, when an input bit sequence is segmented into code blocks, the size which can be maximally segmented may be determined according to system requirements.

The data block may previously include a CRC code therein. An initial data block before the CRC code is attached to the data block may be referred to as initial input bits or a transport block. The transport block may mean data transmitted from an upper layer.

Referring to FIG. 8, a data block having a size B is input to a function module (step S801). The data block may include a first CRC code indicating an error detection code for input bits.

The function module compares the size B of the data block (or input bits) with a maximum code block size Z (step S802).

If the data block size B is larger than the maximum code block size Z in step S802, the function module calculates the number C of code blocks segmented by the input data block in consideration of a CRC size to be attached to the code blocks (step S803).

After calculating the number C of code blocks in step S803, the function module calculates the size K+ or K− of each code block (step S804).

The size of each code block may be calculated by various methods in step S804. Namely, methods of calculating the size of each code block described in the first to ninth embodiments of the present invention may be used. As an example, the size of each code block may be calculated using the modified input bit sequence size B'.

After calculating the number and size of code blocks considering a CRC size, the function module calculates a filler bit length by subtracting the modified input bit sequence size B' from the code block size (step S805).

After calculating the number and size of code blocks through steps S803 to S805, the function module allocates data and a second CRC code (step S806). The second CRC code is different in function from the first CRC code included in the data block. The first CRC code is an error detection code for the data block and the second CRC code is an error detection code for code blocks segmented by the data block.

If the data block size B is not larger than the maximum code block size Z in step S802, it is unnecessary to segment the data block. That is, the number C of code blocks is set to 1 and steps for calculating the code block size and the filler bit length are omitted. Accordingly, data can be directly allocated to the input data block (step S807). At this time, the first CRC code included in the data block may be used and the second CRC code is not newly attached.

Figure 9:
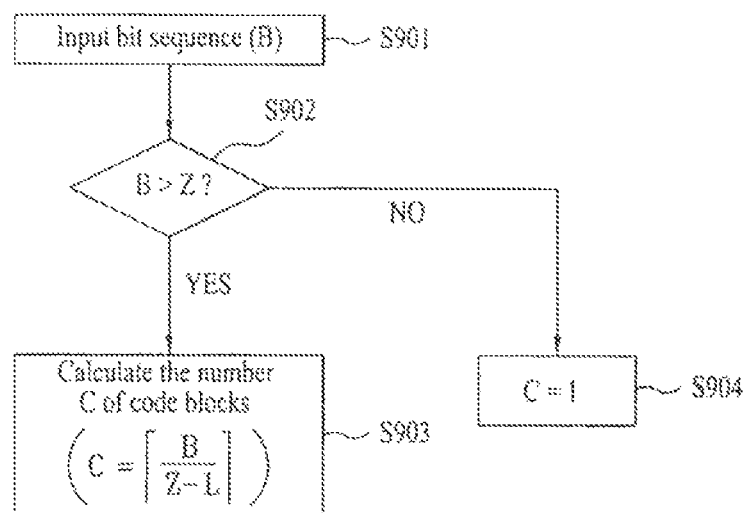

FIG. 9 is a flow chart illustrating a process of calculating the number C of code blocks according to an exemplary embodiment of the present invention.

Steps S901 and S902 in FIG. 9 are similar to steps S801 and S802 in FIG. 8 and therefore a description thereof will be omitted.

Referring to FIG. 9, if the data block size B is larger than the maximum code bock size Z in step S902, the number c of code blocks is calculated by rounding up a value which is obtained by dividing the data block size B by the result of subtracting the second CRC code size L from the maximum code block size Z (step S903).

If the data block size B is not larger than the maximum code bock size Z in step S902, it is unnecessary to segment the input data block and the number C of code blocks is set to 1 (step S904).

Figure 10:
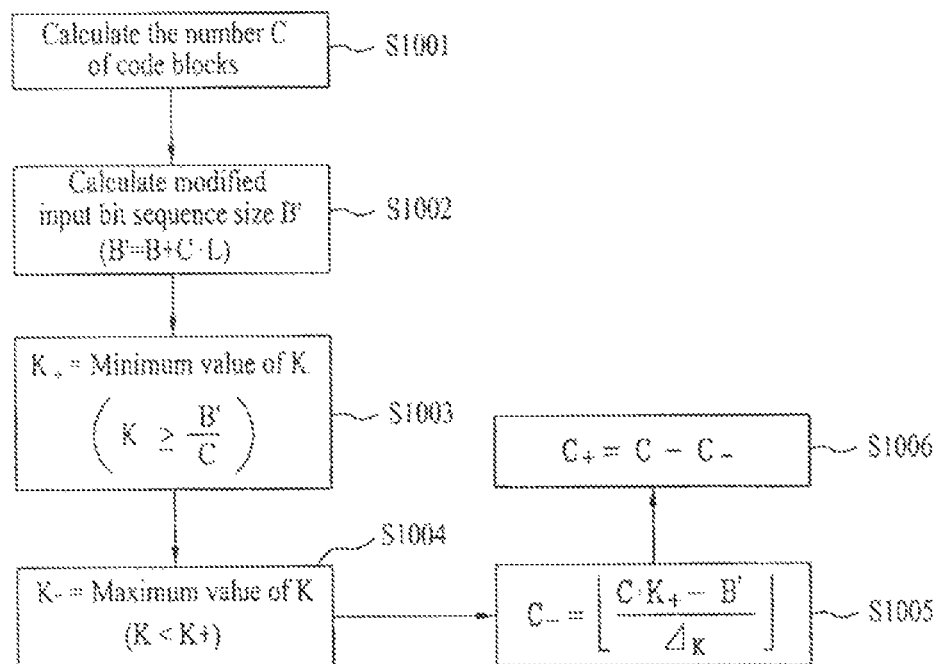

FIG. 10 is a flow chart illustrating a process of segmenting a data block using a modified input bit sequence size according to an exemplary embodiment of the present invention.

Data of a large size may be segmented, before transmission, into data of proper sizes according to system requirements to effectively transfer data. Accordingly, it is necessary to segment an input data block by an appropriate method. It may be important to determine which method is to be used for data block segmentation.

A logical data block segmentation and CRC attachment unit according to the exemplary embodiment of the present invention is comprised of one function module. The function module segments an input data block into code blocks of a proper number and adds data by calculating the size of each code block.

Referring to FIG. 10, if a data block (i.e., input bits) is input to the function module, the function module calculates the number C of code blocks segmented by the data block (step S1001). The data block may include a first CRC code indicating an error detection code for the input bits.

After calculating the number C of code blocks, the function module calculates a modified input bit sequence size B' for acquiring the size K of each code block (step S1002).

In step S1002, the modified input bit sequence size B' may be calculated by adding the data block size B to the result of multiplying the number C of code blocks by a second CRC size L to be attached to the code block. The modified input bit sequence size is used to calculate the size K of each code block.

The code block may be comprised of first code blocks and second code blocks. The size $K_+$ of the first code blocks and the size $K_-$ of the second code blocks are not fixed values and are variable according to system requirements. The size K indicates the size of each code block when the code blocks have a fixed size.

After the modified input bit sequence size B' is calculated in step S1002, the size $K_+$ of the first code blocks may be calculated using a minimum value among the values k shown in Table 1. However, the values K should be above a value obtained by dividing the modified input bit sequence size B' by the number C of code blocks (step S1003).

If the size $K_+$ of the first code blocks is determined, the size $K_-$ of the second code blocks is calculated using a maximum number of the values K shown in Table 1. However, the values K for calculating the size $K_-$ of the second code blocks should be a maximum value among values less than the size $K_+$ of the first code blocks (step S1004).

The function module may calculate the number $C_-$ of the second code blocks using the first code block size $K_+$ and the modified input bit sequence size B'. The function module calculates a difference value $\Delta K$ between the first code block size $K_+$ and the second code block size $K_-$. The function module calculates the number $C_-$ of the second code blocks by rounding down a value obtained by dividing a value of the number C of code blocks times the first code block size minus the modified input bit sequence size by the difference value $\Delta K$ (step S1005).

The number $C_+$ of first code blocks is calculated by subtracting the number $C_-$ of second code blocks from the total number C of code blocks (step S1006).

The proper size of code blocks segmented by the input bits can be calculated using the method described with reference to FIG. 10. In more detail, the size of each code block can be calculated using the modified input bit sequence size even when the size of each code block is different according to system requirements as well as when code blocks have a fixed size.

Figure 11:
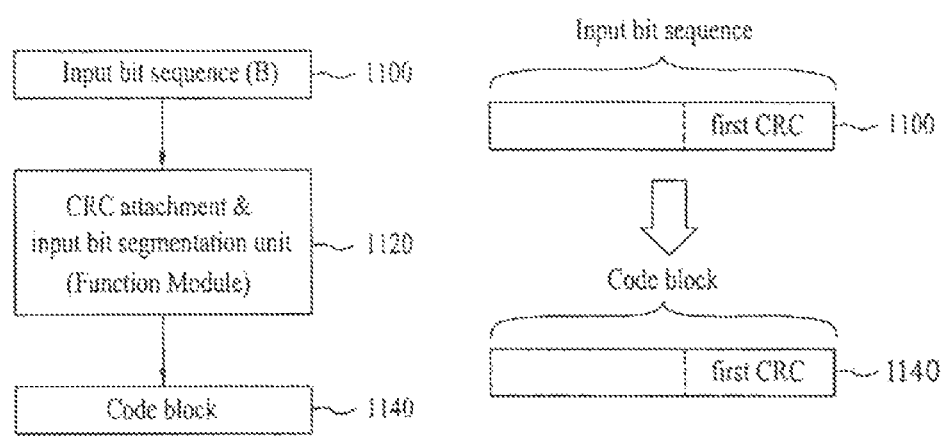

FIG. 11 is a diagram illustrating a process of converting a data block into code blocks when the number C of code blocks is 1 according to an exemplary embodiment of the present invention.

Data of a large size may be segmented, before transmission, into data of proper sizes according to system requirements. Accordingly, it is necessary to segment an input data block by an appropriate method. It may be important to determine which method is to be used for data block segmentation.

A logical data block segmentation and CRC attachment unit according to the exemplary embodiment of the present invention is comprised of one function module to segment an input data block considering the size of an error detection code (for example, CRC code) included in code blocks segmented by an input bit sequence.

However, a maximum segmentation size may be determined according to system requirements when an input bit sequence is segmented into code blocks. A description will be given of a data processing method when an input bit size B is less than or equal to the maximum code block size Z.

FIG. 11 shows a process of converting input bits 1100 input to a function module (a CRC attachment unit and input bit segmentation unit 1120) into a code block 1140. In more detail, the input bits 1100 are input to the function module 1120. The input bits 1100 may include a first CRC code indicating an error detection code for the input bits 1100.

The function module 1120 compares the size of the input bits 1100 with the maximum code block size Z. If the input bit size is less than or equal to the maximum code block size Z, the input bits are not segmented in the function module 1120 and may be comprised of the code block 1140.

Therefore, the input bits 1100 are converted into the code block 1140 and the code block 1140 may use the first CRC code. Since the first CRC code is used as an error detection code for the code block 1140, the function module 1120 does not attach a second CRC code to the code block 1140.

Referring to FIG. 11, if the input bit size is less than or equal to the maximum code block size Z, the input bits 1100 are not segmented and are used as the code block 1140. Namely, the number C of code blocks is 1 and a code block size K may be equal to the input bit size B. Further, the first CRC code included in the input bits 1100 can be used without attaching the second CRC code to the code block 1140. Accordingly, it is possible to rapidly process data.

Eleventh Embodiment

Another exemplary embodiment of the present invention may be configured by a combination of the methods described in the first to tenth embodiments.

The eleventh embodiment may be used when the code block size K is always constant and filler bits may occur. The process of calculating the number C of code blocks is the same as the process described in the fourth or fifth embodiment. However, in the eleventh embodiment, the size Kr of each code block is the same.

The following Equation 34 illustrates a method of calculating the code block size Kr and a filler bit length F (that is, the number of filler bits).

$$Kr=B'/C$$

$$\text{Number of filler bits: } F=C*Kr-B' \qquad \text{[Equation 34]}$$

In Equation 34, the code block size Kr is calculated by dividing the modified input bit sequence size B' by the number C of code blocks. At this time, 'r' indicates an index of a code block. The filler bit length F is calculated by subtracting the modified input bit sequence size B' from the result of multiplying the number C of code blocks by the code block size Kr. That is, the eleventh embodiment shows a method of calculating the code block size Kr when the size of each of all code blocks is the same.

Table 14 illustrates a configuration equation of a code block generated in consideration of a CRC size and the filler bit length F.

TABLE 14

| Syntax | Value | Notes |
|---|---|---|
| for k = 0 to F−1<br>  $c_{0k}$ = <NULL><br>end for<br>k = F<br>s = 0<br>for r = 0 to C−1<br>  while (k < $K_r$−L)<br>    $c_{rk} = b_s$<br>    k = k + 1<br>    s = s + 1<br>  end while<br>  if C > 1<br>    while k < Kr<br>      $c_{rk} = p_{r(k+L-Kr)}$ | | The sequence $c_{r0}$, $c_{r1}$, $c_{r2}$, ..., $c_{r(Kr-L-1)}$ is used to calculate the CRC parity bits $p_{r0}$, $p_{r1}$, $p_{r2}$, ..., $p_{r(L-1)}$ according to subclause 5.1.1 with the generator polynomial gCRC24B(D). For CRC calculation it is assumed that filler bits, if present, have the value 0. |
|       k = k + 1<br>    end while<br>  end if<br>  k = 0<br>end for | | |

It can be understood through Table 14 that the function module configures code blocks in consideration of a CRC size. In Table 14 a code block sequence $c_{r0}$, $C_{r1}$, $c_{r2}$, ..., $c_{r(Kr-1)}$ may be used to calculate CRC parity bits $p_{r0}$, $p_{r1}$, $p_{r2}$, ..., $p_{r(L-1)}$.

In another exemplary embodiment of the present invention, an error detection code included previously in the data block may be referred to as a transport block (TB) CRC (or first error detection code) and an error detection code included in code blocks to be segmented may be referred to as a code block (CB) CRC (or second error detection code).

When segmentation of the input data block is not performed (i.e., C=1), the input data block may be constructed by a final code block including a TB CRC. However, the final code block may be constructed by attaching a CB CRC instead of a TB CRC according to user requirements and embodiments of the present invention.

Twelfth Embodiment

Another exemplary embodiment of the present invention may be configured by a combination of the methods described in the first to tenth exemplary embodiments. The twelfth embodiment may be used when the code block size is constant and filler bits may not occur. Namely, the input bit size is equal to the total number of code blocks.

The twelfth embodiment may be used when the size Kr of each code block is the same. The process of calculating the number C of code blocks is the same as the process described in the fourth or fifth embodiment.

The following Equation 35 illustrates a method of calculating the code block size Kr.

$$Kr=B'/C \qquad \text{[Equation 35]}$$

In Equation 35, the code block size Kr is calculated by dividing the modified input bit sequence size B' by the number C of code blocks. At this time, Kr indicates the size of a code block and 'r' indicates an index of a code block.

Table 15 illustrates a configuration equation generated in consideration of a CRC size L.

TABLE 15

| Syntax | Value | Notes |
|---|---|---|
| k = 0<br>s = 0<br>for r = 0 to C−1<br>  while (k < $K_r$−L)<br>    $c_{rk} = b_s$<br>    k = k + 1<br>    s = s + 1<br>  end while<br>  if C > 1<br>    while k < Kr<br>      $c_{rk} = p_{r(k+L-Kr)}$ | | The sequence $c_{r0}$, $c_{r1}$, $c_{r2}$, ..., $c_{r(Kr-L-1)}$ is used to calculate the CRC parity bits $p_{r0}$, $p_{r1}$, $p_{r2}$, ..., $p_{r(L-1)}$ according to subclause 5.1.1 with the generator polynomial gCRC24B(D). For CRC calculation it is assumed that filler bits, if present, have the value 0. |
|       k = k + 1<br>    end while<br>  end if<br>  k = 0<br>end for | | |

It can be understood through Table 15 that the function module configures code blocks in consideration of a CRC size. In Table 15, a code block sequence $c_{r0}$, $c_{r1}$, $c_{r2}$, ..., $c_{r(Kr-1)}$ may be used to calculate CRC parity bits $p_{r0}$, $p_{r1}$, $p_{r2}$, ..., $p_{r(L-1)}$.

In another exemplary embodiment of the present invention, an error detection code included previously in the data block may be referred to as a transport block (TB) CRC (or first error detection code) and an error detection code included in code blocks to be segmented may be referred to as a code block (CB) CRC (or second error detection code).

When the input data block is not segmented (i.e., C=1), the input data block may be constructed by a final code block including a TB CRC. However, the final code block may be constructed by attaching a CB CRC instead of a TB CRC according to user requirements and embodiments of present invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The exemplary embodiments of the present invention may be applied to wireless access systems. Besides, the exemplary embodiments of the present invention may be applied to all methods of generating code blocks segmented by an input bit sequence. The code blocks generated according to the exemplary embodiments of the present invention are applicable to coding, multiplexing, and interleaving of a physical channel. The present invention is not limited to what has been particularly shown and described hereinabove, rather may be applied to all technologies within the scope of the present invention.

What is claimed is:

1. A method for transmitting data in a wireless access system, the method comprising:
   obtaining a number C of code blocks by an equation $C=\lceil B/(Z-L)\rceil$, wherein B denotes a size of an input bit sequence, wherein Z denotes a maximum size of the code blocks, and wherein L denotes a size of a cyclic redundancy check (CRC) to be attached to each of the code blocks;
   obtaining a size B' of a modified input bit sequence according to an equation $B'=B+C*L$;
   generating the code blocks based on the number C of the code blocks and the size B' of the modified input bit sequence; and
   transmitting the data using the code blocks.

2. The method according to claim 1, wherein the obtaining the number C is performed when the size B of the input bit sequence is larger than the maximum size Z of the code blocks.

3. The method according to claim 1, further comprising attaching the CRC to each of the code blocks for detecting whether each of the code blocks contains errors.

4. The method according to claim 1, further comprising generating the input bit sequence by attaching the CRC to the data.

5. The method according to claim 1, wherein the size L of the CRC is 24 bits and the maximum size Z of the code blocks is 6144 bits.

6. The method according to claim 1, wherein the obtaining the number C further includes considering the size of the CRC attached to each of the code blocks.

7. An apparatus configured for transmitting data in a wireless access system, the apparatus comprising:
   a transmitter; and
   a controller configured to:
      obtain a number C of code blocks by an equation $C=\lceil B/(Z-L)\rceil$, wherein B denotes a size of an input bit sequence, wherein Z denotes a maximum size of the code blocks, and wherein L denotes a size of a cyclic redundancy check (CRC) to be attached to each of the code blocks;
      obtain a size B' of a modified input bit sequence according to an equation $B'=B+C*L$;
      generate the code blocks based on the number C of the code blocks and the size B' of the modified input bit sequence; and
      cause the transmitter to transmit the data using the code blocks.

8. The apparatus according to claim 7, wherein the controller is further configured to obtain the number C of the code blocks when the size B of the input bit sequence is larger than the maximum size Z of the code blocks.

9. The apparatus according to claim 7, wherein the CRC is attached to each of the code blocks for detecting whether each of the code blocks contains errors.

10. The apparatus according to claim 7, wherein the input bit sequence is generated by attaching a CRC to the data.

11. The apparatus according to claim 7, wherein the size L of the CRC is 24 bits and the maximum size Z of the code blocks is 6144 bits.

12. The apparatus according to claim 7, wherein the controller is further configured to consider the number C based on the size of the CRC attached to each of the code blocks.

* * * * *